United States Patent
Downey et al.

(10) Patent No.: US 9,136,866 B2
(45) Date of Patent: Sep. 15, 2015

(54) DIGITAL-TO-ANALOG CONVERTER AND A METHOD OF OPERATING A DIGITAL-TO-ANALOG CONVERTER

(71) Applicants: Fergus John Downey, Edinburgh (GB); Roderick McLachlan, Edinburgh (GB)

(72) Inventors: Fergus John Downey, Edinburgh (GB); Roderick McLachlan, Edinburgh (GB)

(73) Assignee: ANALOG DEVICES GLOBAL, Hamilton (BM)

( * ) Notice: Subject to any disclaimer, the term of this patent is extended or adjusted under 35 U.S.C. 154(b) by 55 days.

(21) Appl. No.: 14/050,081

(22) Filed: Oct. 9, 2013

(65) Prior Publication Data

US 2015/0097712 A1    Apr. 9, 2015

(51) Int. Cl.

| | |
|---|---|
| *H03M 1/66* | (2006.01) |
| *H03M 1/78* | (2006.01) |
| *H03M 1/12* | (2006.01) |
| *H03M 1/74* | (2006.01) |
| *H03M 1/00* | (2006.01) |

(52) U.S. Cl.
CPC .............. *H03M 1/785* (2013.01); *H03M 1/664* (2013.01); *H03M 1/00* (2013.01); *H03M 1/12* (2013.01); *H03M 1/747* (2013.01)

(58) Field of Classification Search
CPC ....... H03M 1/747; H03M 1/00; H03M 1/785; H03M 1/12
USPC .................. 341/144, 145, 154, 118, 120, 153
See application file for complete search history.

(56) References Cited

U.S. PATENT DOCUMENTS

2004/0257254 A1 *  12/2004  Jiang et al. .................... 341/145

* cited by examiner

*Primary Examiner* — Joseph Lauture
(74) *Attorney, Agent, or Firm* — Kenyon & Kenyon LLP

(57) ABSTRACT

A digital-to-analog converter (DAC) comprising a first section having a first plurality of current flow paths forming binary weighted values in the DAC; and a second section connected to the first section and having a second plurality of current flow paths, wherein each of the first and second plurality of current flow paths are switchable between first and second nodes, and wherein weights of one or more of the second plurality of current flow paths are notionally equal to weights of one or more of the first plurality of current flow paths so as to provide redundancy in the first section.

20 Claims, 18 Drawing Sheets

| DAC Code | Code / Weighting | | | | | | | |
|---|---|---|---|---|---|---|---|---|
| | 1a<br>1 | 2a<br>2 | 4a<br>4 | 8a<br>8 | 16a<br>16 | 16b<br>16 | 12a<br>12 | Red<br>4 |
| 0 | 0 | 0 | 0 | 0 | 0 | 0 | 0 | 0 |
| 1 | 1 | 0 | 0 | 0 | 0 | 0 | 0 | 0 |
| 2 | 0 | 1 | 0 | 0 | 0 | 0 | 0 | 0 |
| 3 | 1 | 1 | 0 | 0 | 0 | 0 | 0 | 0 |
| 4 | 0 | 0 | 0 | 0 | 0 | 0 | 0 | 1 |
| 5 | 1 | 0 | 0 | 0 | 0 | 0 | 0 | 1 |
| 6 | 0 | 1 | 1 | 0 | 0 | 0 | 0 | 0 |
| 7 | 1 | 1 | 1 | 0 | 0 | 0 | 0 | 0 |
| 8 | 0 | 0 | 1 | 0 | 0 | 0 | 0 | 1 |
| 9 | 1 | 0 | 1 | 0 | 0 | 0 | 0 | 1 |
| 10 | 0 | 1 | 0 | 1 | 0 | 0 | 0 | 0 |
| 11 | 1 | 1 | 0 | 1 | 0 | 0 | 0 | 0 |
| 12 | 0 | 0 | 0 | 1 | 0 | 0 | 0 | 1 |
| 13 | 1 | 0 | 0 | 1 | 0 | 0 | 0 | 1 |
| 14 | 0 | 1 | 1 | 1 | 0 | 0 | 0 | 0 |
| 15 | 1 | 1 | 1 | 1 | 0 | 0 | 0 | 0 |
| 16 | 0 | 0 | 1 | 1 | 0 | 0 | 0 | 1 |
| ... | | | | | | | | |
| 46 | 0 | 1 | 1 | 1 | 1 | 1 | 0 | 0 |
| 47 | 1 | 1 | 1 | 1 | 1 | 1 | 0 | 0 |
| 48 | 0 | 0 | 1 | 1 | 1 | 1 | 0 | 1 |
| 49 | 1 | 0 | 1 | 1 | 1 | 1 | 0 | 1 |
| 50 | 0 | 1 | 1 | 0 | 1 | 1 | 1 | 0 |

FIG. 11

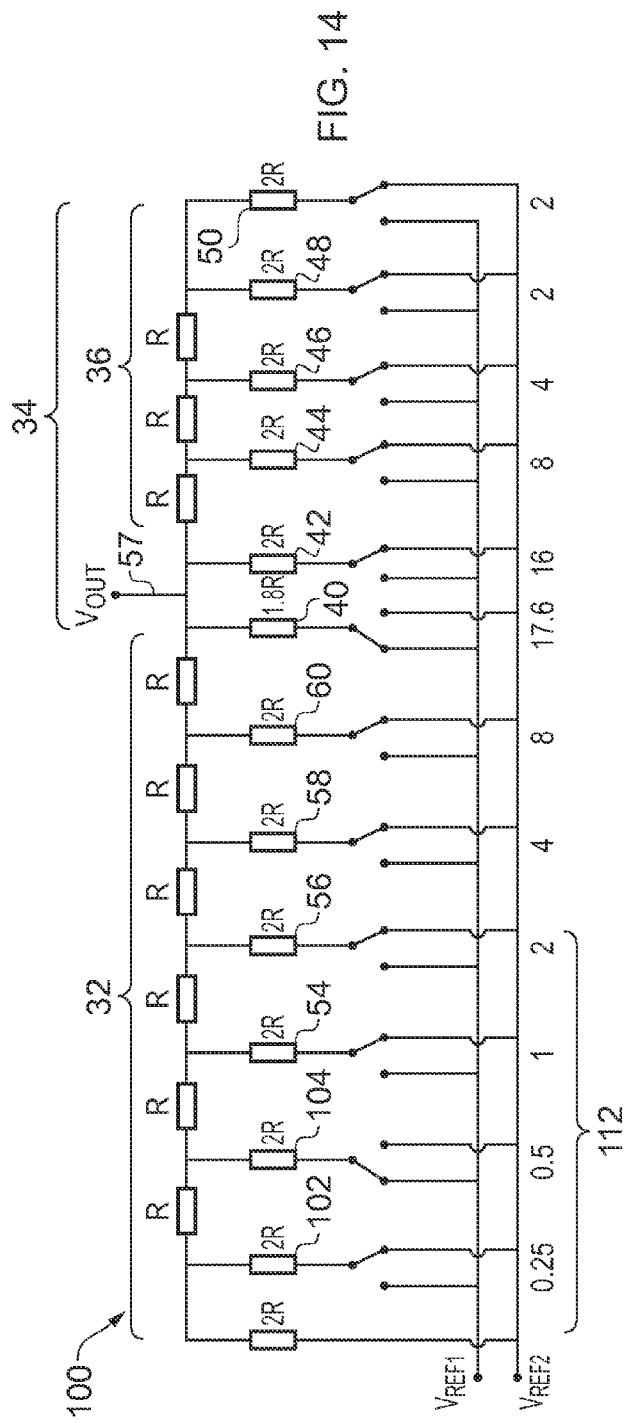
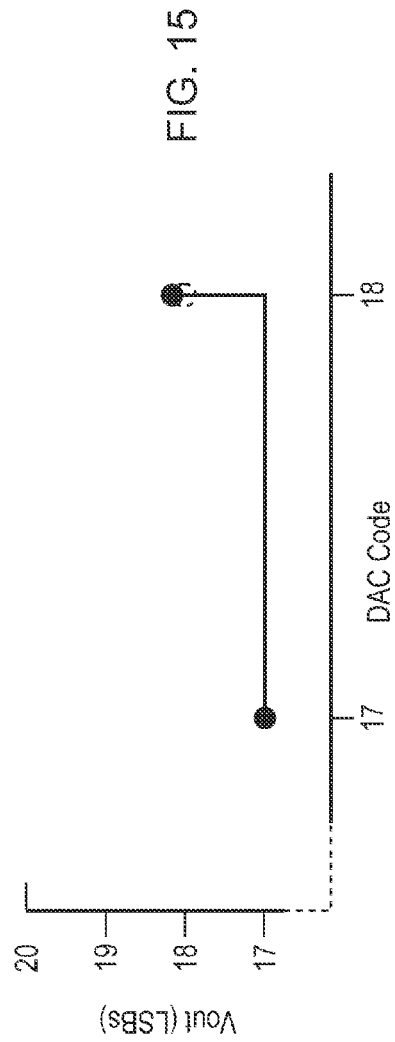

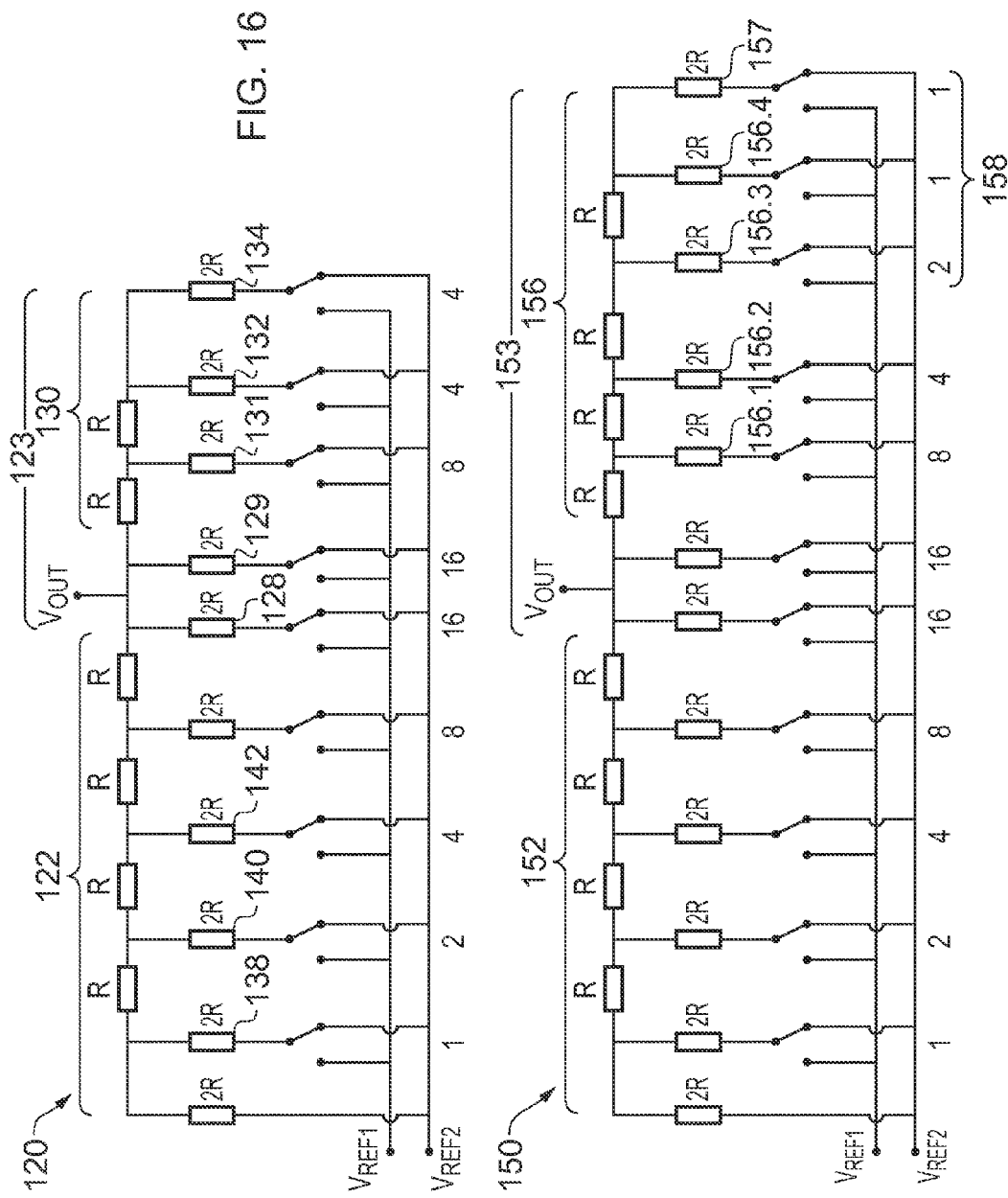

| DAC Code | Code / Weighting | | | | | | | |
|---|---|---|---|---|---|---|---|---|
| | 1a<br>1 | 2a<br>2 | 4a<br>4 | 8a<br>8 | 16a<br>16 | 16b<br>16 | 8a<br>8 | Red<br>8 |
| 0 | 0 | 0 | 0 | 0 | 0 | 0 | 0 | 0 |
| 1 | 1 | 0 | 0 | 0 | 0 | 0 | 0 | 0 |
| 2 | 0 | 1 | 0 | 0 | 0 | 0 | 0 | 0 |
| 3 | 1 | 1 | 0 | 0 | 0 | 0 | 0 | 0 |
| 4 | 0 | 0 | 1 | 0 | 0 | 0 | 0 | 0 |
| 5 | 1 | 0 | 1 | 0 | 0 | 0 | 0 | 0 |
| 6 | 0 | 1 | 1 | 0 | 0 | 0 | 0 | 0 |
| 7 | 1 | 1 | 1 | 0 | 0 | 0 | 0 | 0 |
| 8 | 0 | 0 | 0 | 0 | 0 | 0 | 0 | 1 |
| 9 | 1 | 0 | 0 | 0 | 0 | 0 | 0 | 1 |
| 10 | 0 | 1 | 0 | 0 | 0 | 0 | 0 | 1 |
| 11 | 1 | 1 | 0 | 0 | 0 | 0 | 0 | 1 |
| 12 | 0 | 0 | 1 | 1 | 0 | 0 | 0 | 0 |
| 13 | 1 | 0 | 1 | 1 | 0 | 0 | 0 | 0 |
| 14 | 0 | 1 | 1 | 1 | 0 | 0 | 0 | 0 |
| 15 | 1 | 1 | 1 | 1 | 0 | 0 | 0 | 0 |
| 16 | 0 | 0 | 0 | 1 | 0 | 0 | 0 | 1 |
| ... | | | | | | | | |
| 46 | 0 | 1 | 1 | 1 | 1 | 1 | 0 | 0 |
| 47 | 1 | 1 | 1 | 1 | 1 | 1 | 0 | 0 |
| 48 | 0 | 0 | 0 | 1 | 1 | 1 | 0 | 1 |
| 49 | 1 | 0 | 0 | 1 | 1 | 1 | 0 | 1 |
| 50 | 0 | 1 | 0 | 1 | 1 | 1 | 0 | 1 |

FIG. 17

| DAC Code | Code / Weighting | | | | | | | | |
|---|---|---|---|---|---|---|---|---|---|
| | 1a<br>1 | 2a<br>2 | 4a<br>4 | 8a<br>8 | 16a<br>16 | 16b<br>16 | 8a<br>8 | Red<br>4 | Red<br>4 |
| 0 | 0 | 0 | 0 | 0 | 0 | 0 | 0 | 0 | 0 |
| 1 | 1 | 0 | 0 | 0 | 0 | 0 | 0 | 0 | 0 |
| 2 | 0 | 1 | 0 | 0 | 0 | 0 | 0 | 0 | 0 |
| 3 | 1 | 1 | 0 | 0 | 0 | 0 | 0 | 0 | 0 |
| 4 | 0 | 0 | 0 | 0 | 0 | 0 | 0 | 1 | 0 |
| 5 | 1 | 0 | 0 | 0 | 0 | 0 | 0 | 1 | 0 |
| 6 | 0 | 1 | 0 | 0 | 0 | 0 | 0 | 1 | 0 |
| 7 | 1 | 1 | 0 | 0 | 0 | 0 | 0 | 1 | 0 |
| 8 | 0 | 0 | 1 | 0 | 0 | 0 | 0 | 1 | 0 |
| 9 | 1 | 0 | 1 | 0 | 0 | 0 | 0 | 1 | 0 |
| 10 | 0 | 1 | 1 | 0 | 0 | 0 | 0 | 1 | 0 |
| 11 | 1 | 1 | 1 | 0 | 0 | 0 | 0 | 1 | 0 |
| 12 | 0 | 0 | 0 | 1 | 0 | 0 | 0 | 1 | 0 |
| 13 | 1 | 0 | 0 | 1 | 0 | 0 | 0 | 1 | 0 |
| 14 | 0 | 1 | 0 | 1 | 0 | 0 | 0 | 1 | 0 |
| 15 | 1 | 1 | 0 | 1 | 0 | 0 | 0 | 1 | 0 |
| 16 | 0 | 0 | 1 | 1 | 0 | 0 | 0 | 1 | 0 |
| ⋮ | | | | | | | | | |
| 59 | 1 | 1 | 1 | 1 | 1 | 1 | 1 | 1 | 0 |
| 60 | 0 | 0 | 1 | 1 | 1 | 1 | 1 | 1 | 1 |
| 61 | 1 | 0 | 1 | 1 | 1 | 1 | 1 | 1 | 1 |
| 62 | 0 | 1 | 1 | 1 | 1 | 1 | 1 | 1 | 1 |
| 63 | 1 | 1 | 1 | 1 | 1 | 1 | 1 | 1 | 1 |

FIG. 18

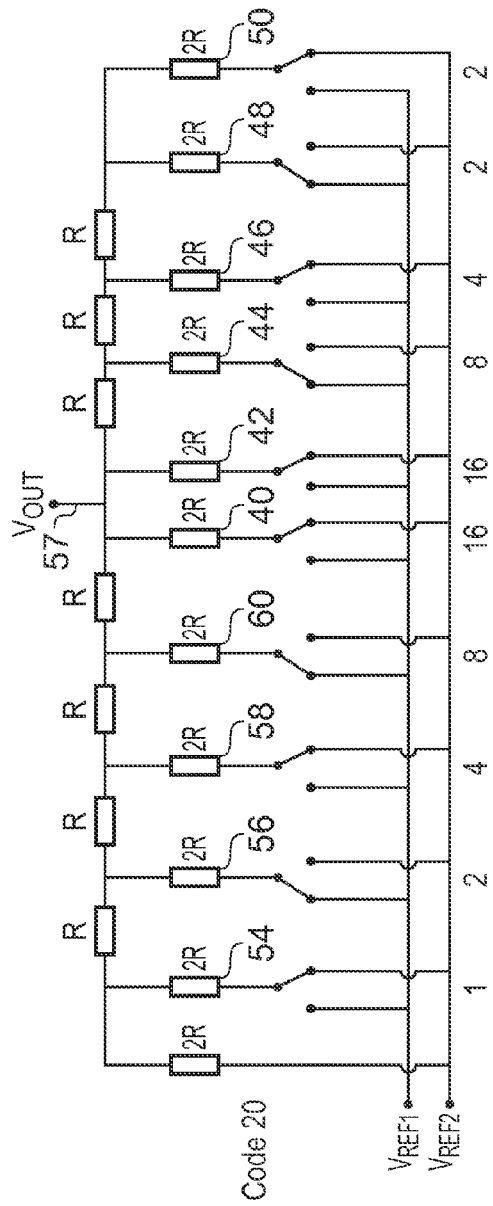
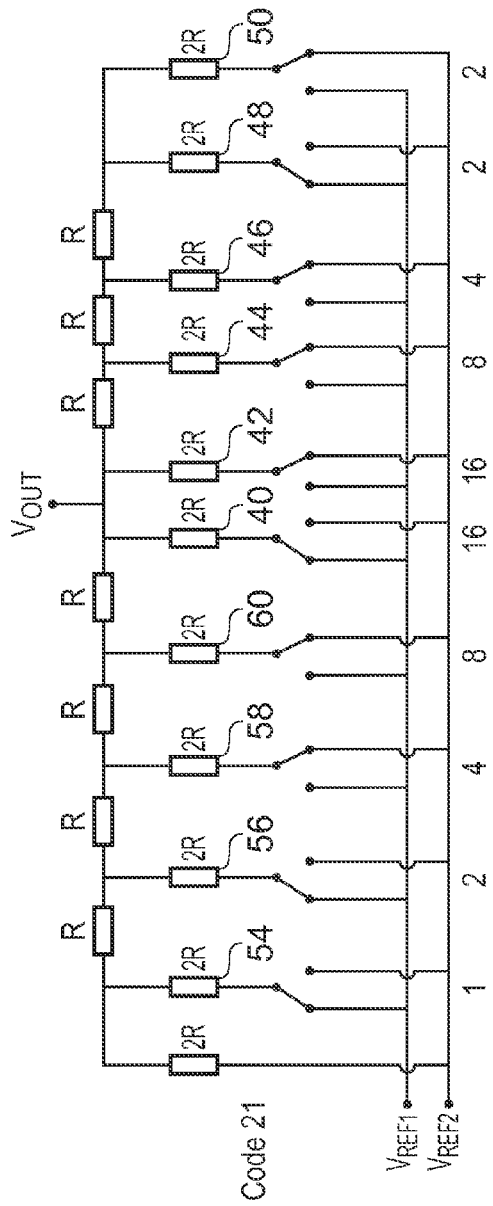
FIG. 25
FIG. 26

| DAC Code | Code / Weighting | | | | | | | |
|---|---|---|---|---|---|---|---|---|
| | 1a<br>1 | 2a<br>2 | 4a<br>4 | 8a<br>8 | 16a<br>16 | 16b<br>16 | 8a<br>8 | 4a<br>4 | Red<br>4 |
| 10 | 0 | 1 | 1 | 0 | 0 | 0 | 0 | 0 | 1 |
| 11 | 1 | 1 | 0 | 1 | 0 | 0 | 0 | 0 | 0 |
| 20 | 0 | 0 | 1 | 1 | 0 | 0 | 1 | 0 | 0 |
| 21 | 1 | 0 | 1 | 0 | 1 | 0 | 0 | 0 | 0 |

DIGITAL-TO-ANALOG CONVERTER AND A METHOD OF OPERATING A DIGITAL-TO-ANALOG CONVERTER

FIELD

This document relates to digital-to-analog converters and in particular segmented R2R digital-to-analog converters and to methods of controlling such devices.

BACKGROUND

A major contribution to non-linearity in digital-to-analog converters (DACs) is component mismatch. Various trimming methods are known to the person skilled in the art to correct for such mismatch. An example of a trimming method is LASER trimming, in which individual components of a fabricated device are physically trimmed using a LASER. LASER trimming is a relatively slow and expensive process which must be performed before the DAC is packaged. Accordingly, there is a limit to its precision due to the subsequent stress undergone by the components in the assembly process, and a cost burden incurred by performing LASER trimming.

SUMMARY

According to first aspect there is provided a digital-to-analog converter (DAC) comprising: a first section having a first plurality of current flow paths forming binary weighted values in the DAC; and a second section connected to the first section having second plurality of current flow paths, wherein each of the first and second pluralities of current flow paths are switchable between first and second nodes, and wherein weights of one or more of the second plurality of current flow paths are notionally equal to weights of one or more of the first plurality of current flow paths so as to provide the first section with redundancy.

The first and second sections may be joined together by a shared connection to an output node of the DAC. The first section may be regarded as being a first binary weighted section.

When the first node is connected to a first reference voltage and the second node is connected to a second reference voltage then the DAC can be operated to output a voltage in a range delimited by the first and second reference voltages, where the output voltage is controlled by a digital code provided to the DAC. If the first and second nodes are held at the same voltages as one another, and the output node is held at a different voltage, then the DAC may be used as a current steering DAC in which the ratio of the currents at the first and second nodes is controlled in response to a digital word supplied to the DAC.

The provision of current flow paths having similar weights can be used to add "redundancy" to the DAC. Redundancy allows the same output to be reached in several ways.

By providing redundancy by virtue of the existence of multiple current flow paths having the same nominal weight, errors in more significantly weighted current flow paths due to non linearity of components of the DAC can be corrected by modification of a switching sequence of the current flow paths in the DAC.

The second section of the DAC may further comprise a second binary weighted section having an output node connected to a first section output node of the first binary weighted section. The second binary weighted section may comprise plurality of current flow paths having weights notionally equal to one or more of the second plurality of current flow paths. As a result both the first and second binary weighted sections can be provided with redundancy.

The second section of the DAC may further comprise a thermometer weighted section having a third plurality of current flow paths forming equally weighted values in the DAC.

Each current flow path, in each of the sections, may comprise an impedance, such as a resistor, in series with a switch which in practice is formed by a plurality of transistors to connect the current flow path to a selected one of the first and second nodes.

The switches may be responsive to a controller.

The controller may be operable to drive the switches of the DAC so as to modify (for example delay or advance) a transition of selected current flow paths in the thermometer section until one or more less significant current flow paths of the first section are connected to a selected one of the first and second node, for example to the first node of the DAC. By doing so, less significant current flow paths in the DAC can be switched between the first and second reference voltages to trim the output voltage so as to accommodate for mismatch in the more significant bits or current paths of the DAC. The controller may drive the switches of the DAC in response to an error value resulting at least partially from errors in values of components in the DAC. Thus, errors in values of components in the DAC which lead to incorrect output voltage values may be corrected such that the output voltage accurately reflects a digital input. The error value may result from errors in values of components of the DAC having a significant contribution (such as a contribution above a threshold value) to the output voltage of the DAC.

The controller may comprise memory for storing information relating to components mismatched in the DAC. The memory may be any suitable volatile and/or non-volatile memory. The value of individual components or error values associated with components may be stored in a look-up table.

In an embodiment, when the first node is connected to a first reference voltage and the second node is connected to a second reference voltage, the first plurality of current flow paths may include a first current flow path and the second plurality of current flow paths may include a second current flow path, the first and second current flow paths each having an output voltage contribution of N volts at an output of the DAC, and the controller is operable to drive the switches of the DAC such that transition of the first and second current flow paths from the first reference voltage to the second reference voltage substantially coincides with a transition of a third current flow path of the DAC having a output voltage contribution of 2N volts from the second reference voltage to the first reference voltage.

According to a second aspect, there is provided a method for driving a digital-to-analog converter (DAC) having a weighted section, said first section comprising a first plurality of current flow paths forming binary weighted values in the DAC, and a second section comprising a second plurality of current flow paths, the first and second sections each contribution to a signal at a DAC output node, and each of the current flow paths in the first and second sections switchable between first and second nodes, wherein weights of one or more of the current flow paths of the second plurality of current flow paths are notionally equal to weights of one or more of the current flow paths of the first plurality of current flow paths so as to provide redundancy in the first section, the method comprising: receiving an input DAC code, deriving an output DAC code; and driving the switches of the DAC based on the output DAC code.

The output DAC code may be derived so as to displace the transition of higher weighted current flow paths such that one or more lower weighted current flow paths of the first binary weighted section contribute to the output of the DAC.

The step of deriving the output DAC code may comprise calculating an error value based on one or more errors in values of components in the DAC, and adjusting the output DAC code based at least partially on the calculated error value.

The error value may result from errors in values of components in current flow paths of the DAC which have a significant contribution to the output voltage of the DAC. The error values need not be restricted to error values that occur as a result of manufacturing variations. Variations in the resistor values that occur during use may be estimated and accounted for. In some instances ohmic heating may occur and may cause the resistor values in the current flow paths to vary. Ohmic heating is a function of the input code to the DAC and the operating voltage. If the operating voltage is assumed or measured, then a code dependent error can be estimated and corrected for. Similarly some technologies, such as polysilicon resistors, can exhibit voltage (or more strictly E-field) dependent changes in impedance. The voltage across a resistor can be calculated based on the input code and operating voltage, and from this a code dependent change in resistance may be calculated and corrected for.

The output DAC code may be derived such that the transition of a current flow path having a voltage contribution to the output of the DAC of N volts from the first reference voltage to the second reference voltage coincides with a transition of a plurality of current flow paths having a combined voltage contribution to the output of the DAC of N volts from the second reference voltage to the first reference voltage so as to modify the transition of the major current flow path from the second reference voltage to the first reference voltage. In an embodiment where the DAC comprises a second section having a second output node connected to a first output node of the first section, the output DAC code may be derived such the transition of a current flow path having a voltage contribution to the output of the DAC of N volts between the first reference voltage and the second reference voltage coincides with a transition of a first current flow path in the first section and a second current flow path in the second section from the second reference voltage to the first reference voltage so as to delay the transition of the major current flow path from the second reference voltage to the first reference voltage, the first and second current flow paths having a combined voltage contribution to the output of the DAC of N volts.

The circuits and configurations herein are suitable for provision as integrated circuits within individual (i.e. respective) integrated circuit packaging. The circuits may also be provided as a sub-system in, for example, digital signal processors, data processors or other integrated circuits needing to bridge the analog and digital domains.

BRIEF DESCRIPTION OF THE FIGURES

Embodiments of digital to analog converters will now be described by way of non-limiting example with reference to the accompanying drawings, in which:

FIG. 11 is a table of switching states of the segmented R2R DAC shown in FIG. 5 based on an input DAC code;

FIG. 14 is a schematic diagram of a variation of the segmented R2R DAC shown in FIG. 5, but, for the purposes of illustrating its mismatch correction capabilities includes a manufacturing mismatch as shown in FIG. 7;

FIG. 15 is a graph of output voltage versus input code for the R2R DAC shown in FIG. 14;

FIG. 16 is a schematic diagram of a variation of the segmented R2R DAC shown in FIG. 5;

FIG. 17 is a table of switching states for the segmented R2R DAC shown in FIG. 16 based on an input DAC code;

FIG. 18 is a table of switching states for the segmented R2R DAC shown in FIG. 16 based on an input DAC code according to an alternative switching regime;

FIG. 19 is a schematic diagram of a further variation of the segmented R2R DAC shown in FIG. 5;

FIGS. 25 and 26 are schematic diagrams of the segmented R2R DAC of FIG. 5 transitioning from input DAC code 20 to input DAC code 21 in accordance with a glitch reduction switching scheme;

DESCRIPTION OF EMBODIMENTS

Figure 1:
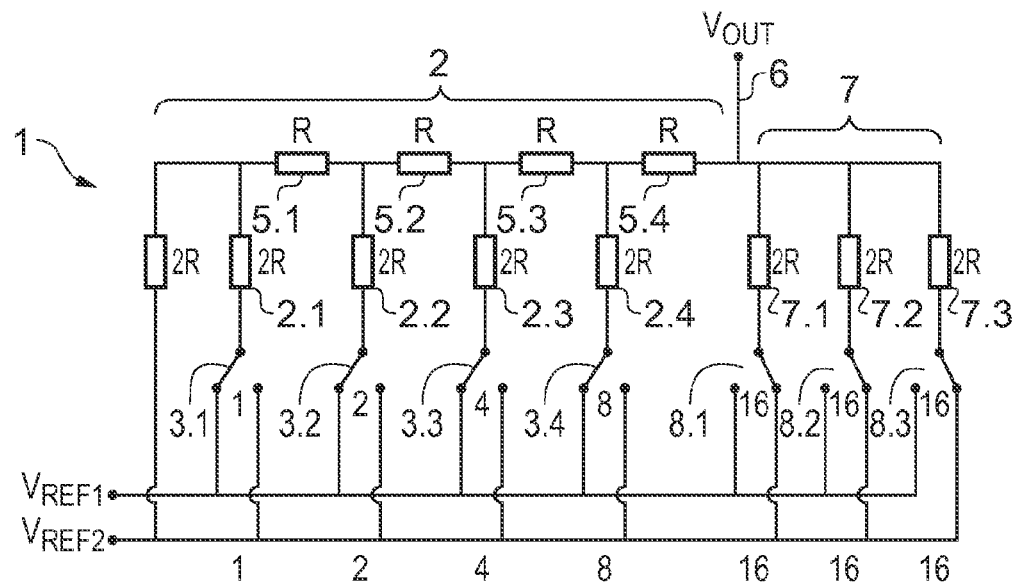
FIG. 1 is a schematic diagram of a an ideal segmented R2R DAC.

FIG. 1 schematically illustrates a 6-bit digital-to-analog converter (DAC) 1. It should be appreciated that, in practice, the teachings given in this document can be applied to DACs of much greater resolution than 6 bits. A 6 bit example has been chosen for the sake of diagrammatic simplicity and ease of explanation.

It is known that component variation during integrated circuit manufacture can give rise to resistor mismatch. Thus in an ideal R-2R ladder (or R2R ladder for ease of notation) all of the resistors have either exactly one arbitrary unit of resistance, R, or two arbitrary units of resistance 2R. The 2R resistors can most easily be formed by two R resistors in series, such that notionally every resistor formed during manufacturing is identical to each other resistor of the DAC.

However, the R-2R design inherently causes some resistors (those nearest an output node 6) to be more strongly weighted than those resistors that are more distant from the output node 6. This increasing weighting, and hence enhanced demand for matching to high accuracy, has resulted in the formation of segmented designs where the DAC can be considered as being formed of first and second connected sections. The DAC 1 comprises a first section 2 in the form of 4-bit R2R ladder network which makes up the four least significant bits of the DAC 1. The 4-bit R2R ladder network comprises a plurality of 2R resistor legs, where R may be any resistance value, each resistor leg comprising a 2R resistor 2.1 to 2.4 and a respective switch 3.1 to 3.4. The individual 2R legs are connected to neighboring 2R legs by way of resistors 5.1 to 5.3. The final resistor 5.4 is provided to delimit the extend of the first section because the device shown in FIG. 1 is segmented. The two most significant bits are provided by a second section 7 in the form of a 2-bit thermometer DAC comprising three parallel, equally weighted 2R resistor legs each also comprising a 2R resistor 7.1 to 7.3 and a switch 8.1 to 8.3 segmented from the R2R ladder network of the first section 2 by the resistor 5.4. Each 2R resistor leg of the DAC 1 is switchable between two reference voltages, $V_{ref1}$ and $V_{ref2}$. Conventionally, these voltages are $V_{ref1}=+V_{dd}$ for logic 1 and $V_{ref2}=0$ for logic 0, but could equally be any two differing voltage values. A leg switched to $V_{ref1}$ may hereafter be referred to as being "set" whilst a leg switched to $V_{ref2}$ may be referred to as being "unset".

The R2R ladder network of the first section 2 operates as a string of potential dividers, such that the four least significant bits are weighted in their contribution to the output voltage $V_{out}$. In contrast, the 2R legs of the second section 7 are all connected to the output directly and, as such, each of their respective contributions to $V_{out}$ is the same. Thus in the example shown the first leg formed by resistor 2.1 and switch 3.1 has the least significant contribution to the output voltage. It is given an arbitrary weight of 1 unit. The next resistor 2.2 contributes twice as much to the output voltage, so has a weight of 2 units. The third resistor 2.3 has an effective weight of 4 units and the fourth resistor 2.4 contributes a weight of 8 units. The presence of the resistor 5.4 at the output of the first section means that the 2R resistors 7.1 to 7.3 each contribute a weight of 16 units to the output voltage at the output node 6.

Because the R2R ladder network of the first section 2 operates as a string of weighted current dividers, the output accuracy is dependent on how well the R and 2R resistors are matched to one another. A small error in the resistance value of the most significant bit (such as resistors 2.4, 7 and 7.1-7.3 in this example) can completely overwhelm the contribution of less significant bits (e.g. 2.1 and 2.2). Accordingly, resistor value mismatch leads to non-linear and non-monotonic behavior of the DAC.

Figure 2:
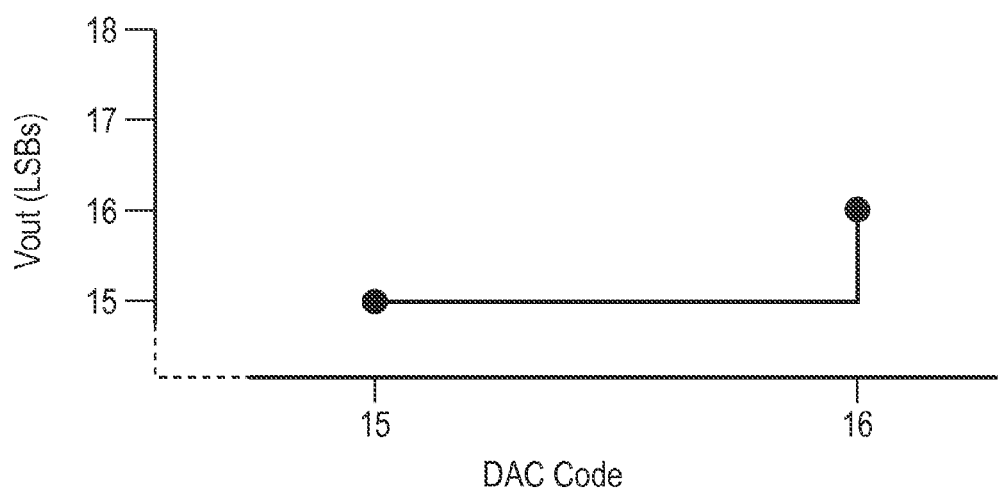
FIG. 2 is a graphic illustration of output voltage versus input code for a code transition of the R2R DAC shown in FIG. 1.

FIG. 2 graphically illustrates the change in voltage output $V_{out}$ at the output node 6 during a transition from an input DAC code of 15 (switching configuration shown in FIG. 1) to code 16. During this transition, bits 1, 2, 4 and 8 of the R2R network of the first section 2, having a collective weight of 15, are switched from $V_{ref1}$ to $V_{ref2}$ (i.e. unset) and the first of the segmented resistors 7.1 in the second section 7 having a relative weight of 16 is switched from ground to $V_{ref}$. Because all of the 2R resistors (2.1 to 2.4, 7.1 to 7.3 are equally matched in this idealized example, the output voltage $V_{out}$ of the output node 6 is raised by a voltage which is identical to that contributed by the resistor of the least significant bit, hereafter referred to as an LSB voltage or 1 unit. It will be appreciated that the output voltage change, $V_{out}$, for each stepwise code transition is equal to 1 LSB voltage which is the value of voltage contribution of the least significant bit of the DAC 1. Accordingly, in the ideal case shown in FIG. 1, the output voltage at output node 6 follows a linear progression between $V_{ref2}$ when all of the switches of the DAC 1 are switched to ground and $V_{ref1}-1$ LSB voltage when all of the switches are switched to $V_{ref1}$. (The output voltage never reaches $V_{ref1}$ since the termination leg of the R2R network is tied to $V_{ref2}$ thus reducing the output voltage by 1 LSB).

Figure 3:
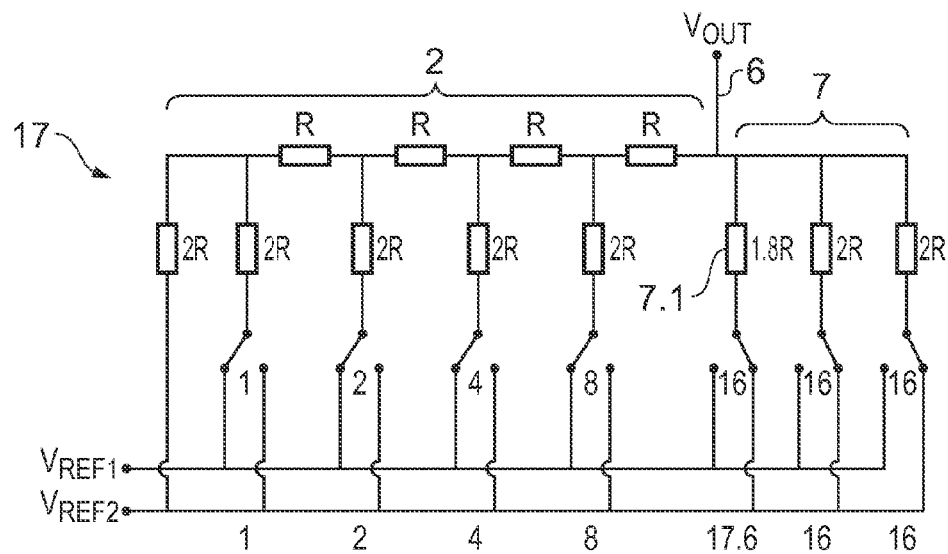
FIG. 3 is a schematic diagram of a known non-ideal segmented R2R DAC and showing relative resistor sizes therein.
Figure 4:
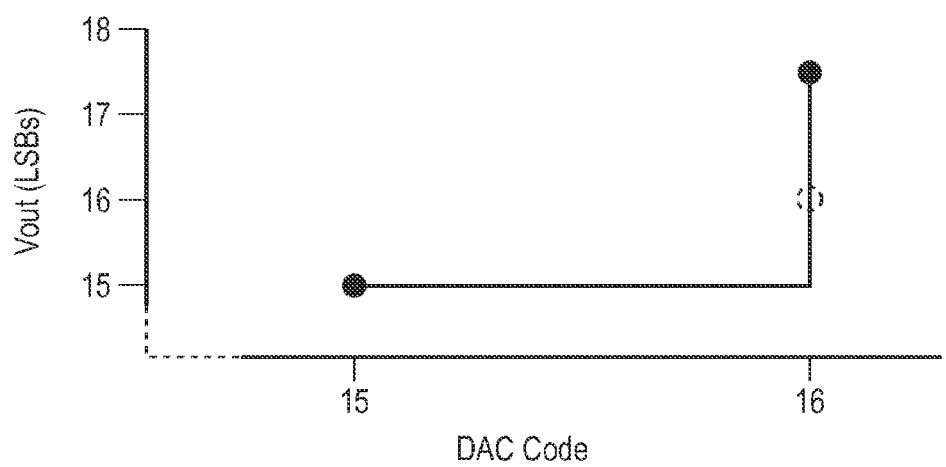
FIG. 4 is a graph of output voltage versus input code for a code transition in the non-ideal R2R DAC shown in FIG. 3.

Referring now to FIG. 3, a DAC 17 which is equivalent to that of FIG. 1 is shown having a 4-bit R2R network in a first section 2 and a 2-bit segmented second section 7. Like parts will be referred to using the designations used in FIG. 1. However, in contrast to the ideal case shown in FIG. 1, a resistor 7.1 of the second section 7 has an inherent 10% error due to a mismatch in its resistance value (1.8R rather than the 2R) relative to the remaining 2R resistors. Accordingly, when this 2R leg 7.1 is switched to $V_{ref1}$, its contribution to $V_{out}$ is approximately 10% more than that of the corresponding leg in FIG. 1, thus contributing a voltage of 17.6 LSBs to the output node 6 instead of the normal 16 LSBs. FIG. 4 graphically illustrates the same transition as that shown in FIG. 2 but for the DAC shown in FIG. 3. As the DAC code is changed from 15 to 16, the four least significant bits 1, 2, 4 and 8 are unset and switched from $V_{ref1}$ to $V_{ref2}$ and at the same time the mismatched 1.8R resistor leg 14.1 is set and switched from $V_{ref2}$ to $V_{ref1}$ resulting in an increase in output voltage at the node 6 of 2.6 LSB voltages. Accordingly the 16 LSB target output voltage is missed altogether, as is the 17 LSB point. The voltage at the node 6 is in fact at 17.6 LSB voltages. Accordingly an error on a more significant resistor leg of a DAC may result in a large output voltage transition meaning that some target voltage levels can never be reached. This error poses a problem when the accurate conversion of a digital signal into an analog voltage is required. It will be appreciated that error due to resistor mismatch of less significant legs of the DAC 17 is much less of a problem than that caused by mismatch in higher weighted legs. The error caused by a mismatch on a more significant leg described above can be compared with the same 10% error on a lower weighted leg of the R2R network 2. For example, a 10% error in the value of resistor 2.2 of the 2 LSB weighted leg of the DAC 17 only causes a 0.2 LSB change in the output value of the DAC 17.

Figure 5:
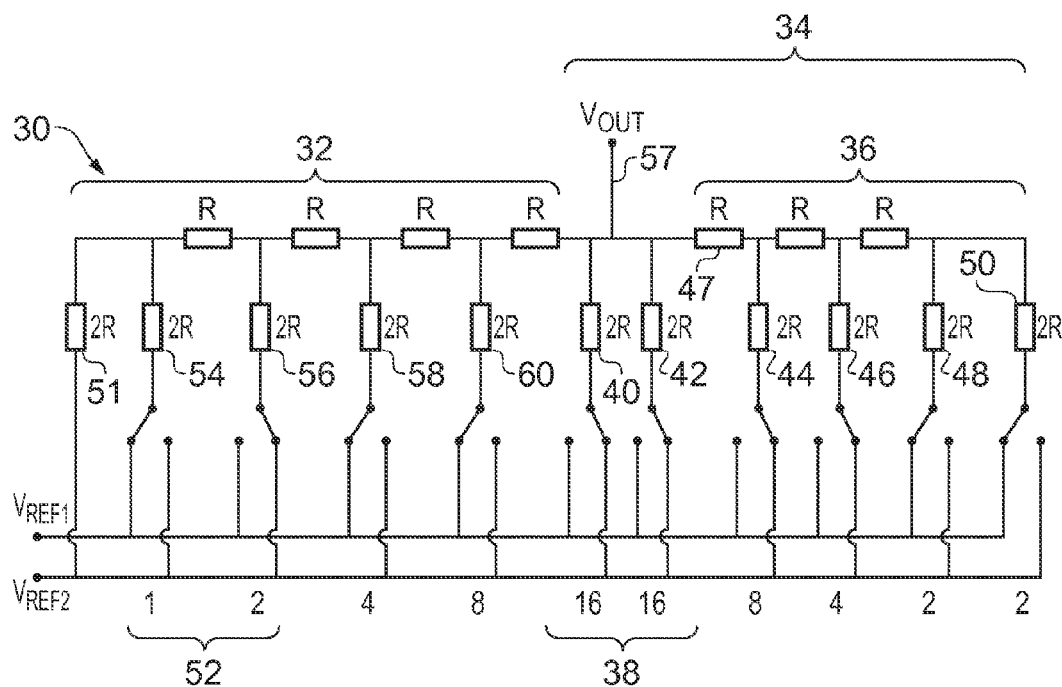
FIG. 5 is a schematic diagram of a segmented R2R DAC in accordance with this disclosure.

FIG. 5 shows an embodiment of a 6 bit DAC 30 in accordance with the teachings of this disclosure. The DAC 30 comprises a first section 32 and a second section 34. The first section 32 is formed by a R-2R ladder network (as described with respect to FIG. 1) having legs 54, 56, 58 and 60. The relative contributions of these legs are 1, 2, 4 and 8 units respectively to an output node 57 of the DAC 30. The legs 54 and 56 can be thought of as representing a less significant portion 52 of the first section 32 and the legs 58 and 60 form a more significant portion of the first section 32. Both the first and second sections connect to an output node 57. The second section comprises a thermometer encoded section 38 which is formed of a plurality of parallel legs 40, 42 that are usable in a thermometer encoded style, in association with a second R-2R ladder network 36. The second R-2R ladder network 36 comprises legs 44 and 46, which, by virtue of a connection to the output node 57 by way of a R valued resistor 47 have effective weights of 8 and 4 units respectively. The extreme end of the R-2R network 36 comprises two parallel legs (not separated by an R value resistor) 48 and 50 which each individually make a contribution of 2 units to the output word.

The legs 44, 46 of the second R2R ladder network 36 may be switched simultaneously as one block or separately. Similarly, the least significant legs, 48, 50 of the second R2R network 36 may be switched simultaneously or separately. In further variations one or more least significant legs of the second R2R network may be left unswitched or tied permanently to Vref2.

By replacing a thermometer 2R leg with the second R2R network 36, redundancy is provided to the architecture due to duplication of equally weighted legs in the main (first) and second R2R networks 32, 36. Accordingly, the lower weighted legs 48, 50 of the second section 34 can be used to modify, for example to delay or advance, transitions of one or more of the higher weighted legs of the first section (e.g. leg 60 of the R2R network of the first section 32 and segmented 2R legs 40, 42 of the second section 34) until the least significant bits 52 of the first R2R network in the first section 32 (not including the terminating leg 51) are contributing more than $V_{ref2}$ to the output voltage $V_{out}$ (e.g., until at least one of the legs 54, 56 of the LSBs 52 are switched to $V_{ref1}$) or have been selected by being "set" by a digital input code. By doing so, component mismatch in the higher weighted bits 40, 42 can be accounted for and corrected by switching the R2R LSBs 52 or the redundancy legs 48, 50 of the second R-2R network to either increase or decrease the total voltage provided to the output node 58. Furthermore, because of the relatively small contribution provided by the legs 48, 50 and the R2R LSBs 52, error in component values of these legs is negligible in comparison with the error introduced by mismatching of the higher weighted bits represented by the thermometer encoded legs 40, 42.

An example incremental transition of the segmented DAC 30 from DAC code 17 to code 18 will now be described with reference to FIGS. 5, 6, 7 and 8. As was the case with FIG. 1, FIG. 5 shows an ideal architecture in which all of the legs of the DAC 30 have a resistance of 2R. The switches of the DAC 30 are set such that the output voltage $V_{out}$ is at 17 LSBs. This contribution comes from bits 1, 4 and 8 of the first (main) R2R DAC of the first section 32 and the two lowest weighted bits 48 and 50 of the second R2R DAC, each having a weight of 2 LSBs from the second section 34. However, instead of switching one of the segmented 2R legs 40, 42 to $V_{ref1}$ at the transition between 15 and 16, this transition has been delayed (shifted to a higher digital code) by the switching of redundancy legs 48, 50 to $V_{ref1}$. By doing so, leg 54 of the R2R LSBs 52 continues to contribute a voltage greater than $V_{ref2}$ to the output node 58. It will be appreciated that in the case of a code decrement, the transition of one of the segmented 2R legs 40, 42 can be considered as being advanced (shifted to a higher digital code).

Figure 6:
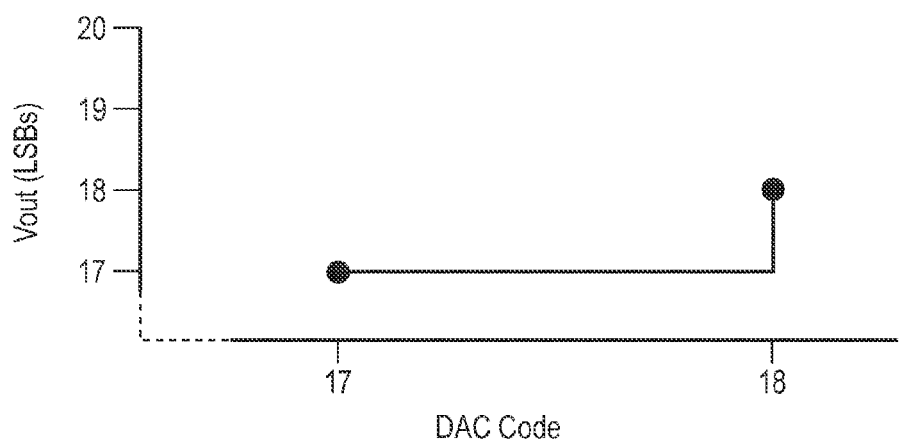
FIG. 6 is a graph of output voltage versus input code for a code transition of the R2R DAC shown in FIG. 5.

During operation, when the input DAC code increases from 17 to 18, one of the 2R legs 40, 42 of the thermometer encoded portion 38 and having a weight of 16 LSBs is set (switched from $V_{ref2}$ to $V_{ref1}$) and simultaneously, legs 54, 58 and 60 having weights of 1, 4 and 8 LSBs respectively are unset (switched from $V_{ref1}$ to $V_{ref2}$) and leg 56, having a weight of 2 LSBs, is set. Accordingly, the total resistance connected between $V_{ref1}$ and the output node 58 provides an output voltage of 16+2=18 LSBs as shown in FIG. 6.

Figure 7:
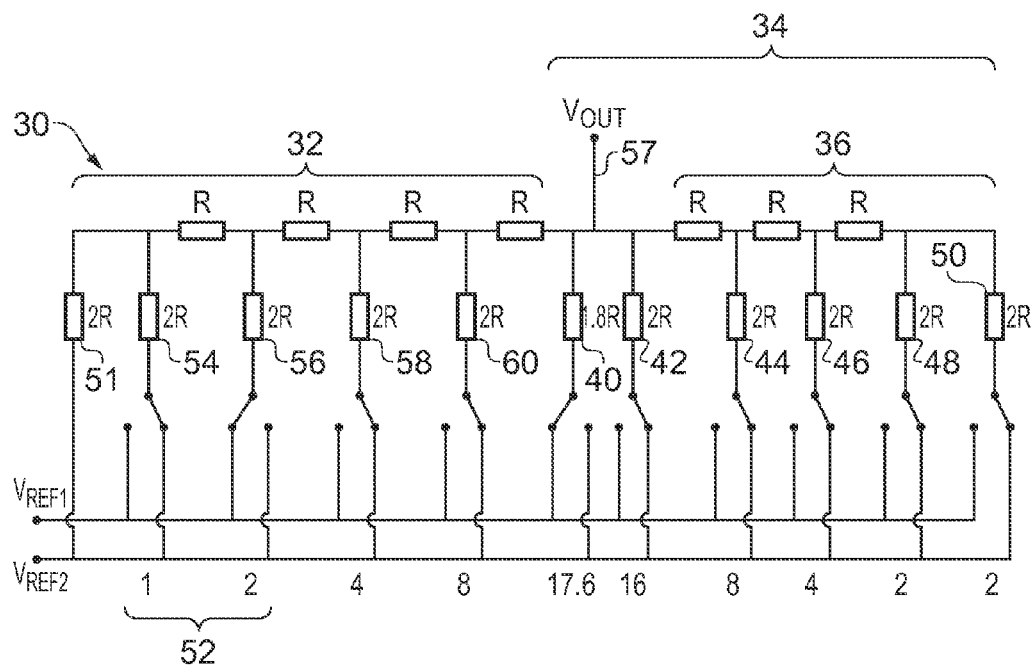
FIG. 7 is a schematic diagram of a segmented R2R DAC where, due to variation in manufacturing, a mismatch has occurred.
Figure 8:
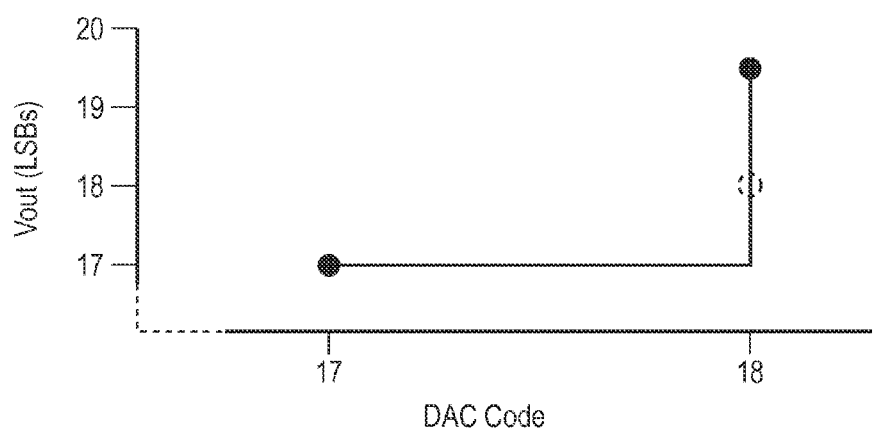
FIG. 8 is a graph of output voltage versus input code for a code of transition of the R2R DAC shown in FIG. 7.

Referring now to the non-ideal case shown in FIG. 7, the segmented DAC 30 of FIG. 5 is shown. However, one of the parallel resistor legs 40, 42 has a resistor value 10% less than it should have (1.8R rather than the 2R), such that it passes more current and hence its contribution to the output value is proportionally greater. Accordingly, the voltage contribution of this leg 40 when connected to $V_{ref1}$ is 17.6 LSBs instead of 16 LSBs. FIG. 8 illustrates the resultant output voltage during transition between DAC codes 17 and 18. As the DAC code transitions from 17 to 18, the output voltage at node 57 increases to 17.6+2=19.6 LSBs, 1.6 LSBs above the target output voltage.

Figure 9:
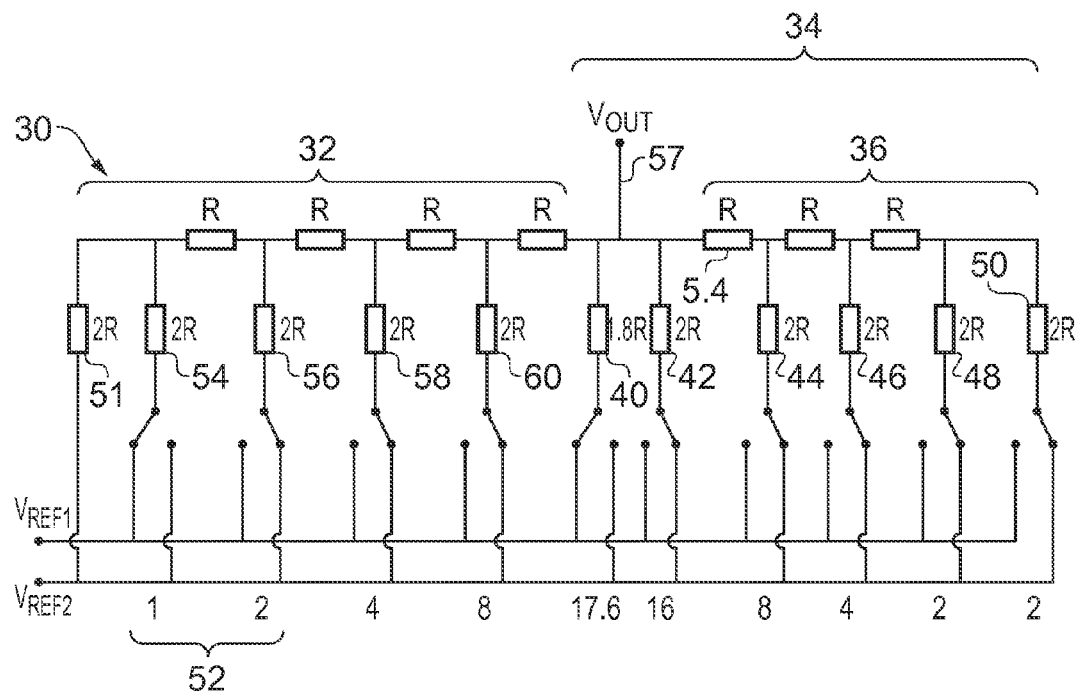
FIG. 9 is a schematic diagram of a segmented R2R DAC.
Figure 10:
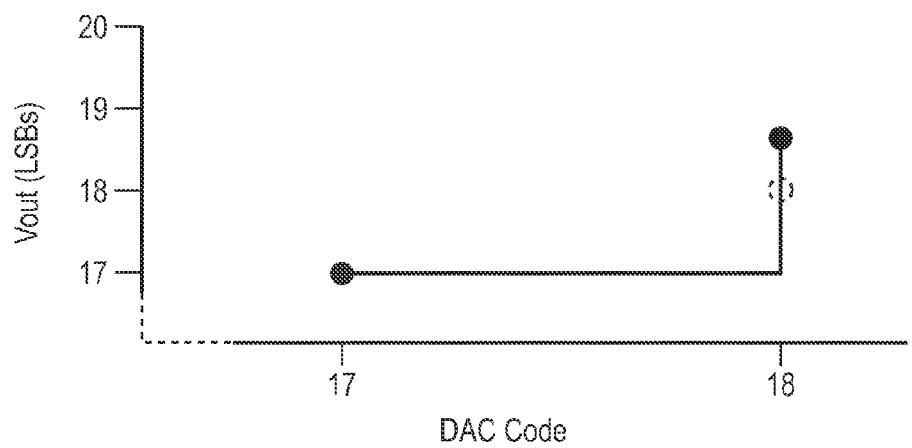
FIG. 10 is a graph of output voltage versus input code for a code transition of the R2R DAC shown in FIG. 9.

In contrast to the prior art architecture in which little could be done to reduce the output voltage down to a required target, because the least significant bits 54, 56 still contribute more than $V_{ref2}$ to the output voltage, in the inventive DAC described here leg 54 can be switched to $V_{ref2}$ and leg 56 switched to $V_{ref1}$, thereby reducing the output voltage by 1 LSB to 18.6 LSBs, as shown in FIGS. 9 and 10.

By careful choice of the switching sequence of the two lower weighted legs 54 and 56 of the main R2R network 32 and the correction legs 48, 50 of the second R2R network 36, errors introduced by higher weighted legs can be accounted for and corrected either by reducing or increasing the output voltage at the output node 57. Furthermore, with an appropriate choice of the leg switching sequence, trimming can be achieved substantially throughout the entire voltage range, i.e. through all DAC codes (0 to 63 in this instance). It will, however, be appreciated that since the error contribution due to mismatch in lower weighted legs is relatively insignificant, trimming below a threshold code value may not be required. For example, trimming may not be required for codes 0 through to 7, since these codes involve contributions from the three least significant legs 54, 56, 58, where errors from mismatch are relatively insignificant.

The legs 48 and 50 of the second section and the legs 54 and 56 of the first section of DAC 30 used to trim the output voltage will be referred to as correction bits, as will the corresponding legs of DACs described below.

It is therefore advantageous to define a modified switching sequence which gives a underlying order of switch transitions for the switches, such that corrections if necessary can be overlaid over the underlying switch sequence to modify it, such corrections having been determined by analyzing the voltage output from the DAC in response to an evaluation sequence of digital words presented to it during a calibration phase as will be described in more detail below.

An example algorithm for calculating the switching sequence of the DAC legs, and in particular the relative transitions of the correction bits will now be described with reference to FIG. 11 together with FIG. 9. In this example, we will assume that the least significant bits 48, 50 of the second R2R network 36 which form the redundancy legs of DAC 30 are toggled simultaneously as a pair. However, as will be described below, in other embodiments the redundancy legs 48, 50 of the second R2R network 36 may be toggled separately.

As mentioned above, due to the relatively low contribution of the legs 54, 56 and 58 in this example of the DAC 30, any error due to resistor value mismatch in these components is less significant than the comparatively large contribution provided by the higher weighted legs. Equally, the redundancy legs 48, 50 are preferably scaled so that any mismatch between them and the equivalent weighted 2R leg in the main R2R network 32 is lower than 1 LSB. For example, the redundancy legs 48, 50 in DAC 30 of FIG. 9 have a combined weighting of 4 LSBs, so the equivalent weighted 2R leg in the main R2R network 32 of DAC 30 is leg 58 also having a weighting of 4 LSBs. A 10% mismatch in the weighting of the resistor in leg 58 equates to 0.4 LSBs, i.e. considerably lower than 1 LSB.

If the weight of the redundancy legs is $2^x$ (LSBs) where x is any positive integer then, any 2R legs with weights lower than $2^x$ in the R2R network of the first section 32 can be regarded as the lower significant bits of the entire DAC and presumed to have non-linearity of significantly less than 1 LSB due to their comparatively low contribution to the overall output voltage $V_{out}$. As mentioned above, these lower significant bits and the redundancy bits may be collectively referred to as the correction bits. Any 2R legs having a weight contribution equal or greater than $2^x$ LSBs are considered the middle bits of the DAC. In the case of the DAC 30, these bits are legs 58 and 60 generally designated middle bits or R2R MSBs (most significant bits of the first R2R DAC). The thermometer encoded legs take the role of the most significant bits of the DAC 30.

In order to convert a standard DAC code, which would be provided to control switches of a conventional segmented DAC, into a code suitable for controlling a segmented DAC having redundancy such as that shown in FIG. 9, the following procedure may be performed. Consider an embodiment where the weighting of the redundancy bit is $2^x$ LSBs. In some embodiments the procedure may be used to move the transition of the middle bits 58 and 60 and the thermometer encoded legs 40 and 42 until the R2R LSBs of the first section 32 have been selected/set (wholly or in part). As part of this procedure $2^x$ may be subtracted from the code for the middle bits 58, 60 of the DAC 30 and the thermometer encoder legs 40, 42 and the more significant legs 44, 46 of the R2R DAC 36 of the second section 34 whilst the code for the LSBs 54, 56 may remain unchanged. For DAC codes below $2^x$, contributions to the output voltage are provided only by the LSBs 54, 56. When the input DAC code is $2^x$ or a multiple thereof, in order to account for the subtraction, the redundancy bits 48, 50 may be set (switched to $V_{ref1}$). When the input is DAC code $2^x+2^{x-1}$, the redundancy bits 48, 50 are unset (switched to $V_{ref2}$). As the DAC code is increased, the redundancy bit continues to switch between $V_{ref1}$ and $V_{ref2}$ every $2^{x-1}$ increments until the final $2^{x-1}$ increment to full scale where it stays high at $V_{ref1}$. So, for example in the case of DAC 30 where the redundancy bit has a weight of 4 LSBs, x=2 and so the redundancy bit is toggled high at code 4 and is then toggled every 2 DAC code increments.

The above switching regime has the effect of delaying (when the code increments) or advancing (when the code decrements) the major transitions of the middle bits 4, 8 and/or the segmented bits 40, 42 until the LSBs 54, 56 are at or near midscale (providing a contribution of $2^{x-1}$ LSBs to the output voltage). The result of this is that the DAC 30 has a $\pm 2^{x-1}$ trim range available for correction of non-linearity in the higher weighted legs 58, 60, 40, 42, 44, and 46.

FIG. 11 shows a table of the adjusted DAC code values provided by the algorithm described above based on a conventional DAC input code. It can be seen from this table that transitions of higher weighted legs have been delayed. For example, conventionally major transitions (of higher weighted legs) between code 7 and 8 and between code 47 and 48 have been shifted to higher digital codes. These transitions now occur between DAC code 9 and 10, and DAC code 49 and 50. Accordingly, the correction bits (LSBs 54, 56 and redundancy bit 48, 50) can be adjusted to correct the output voltage in both a positive and a negative direction.

Taking the transition between codes 49 and 50 as an example, if the output voltage is too high, the leg 54 can be set (switched to $V_{ref1}$) and the leg 56 can be unset (switched to $V_{ref2}$) thus reducing the output voltage by 1 LSB. Equally, if the output voltage $V_{out}$ is too low then one or more of the leg 54 and the redundancy legs 48, 50 can be set to increase $V_{out}$ by up to 5 LSBs.

It will be appreciated that in order to account for and correct component mismatch, it is preferable to have knowledge of any mismatched resistors prior to operation of the DAC. In particular, it is advantageous for the respective resistance values of the each of the higher weighted (more significant) current flow paths of the DACs to be measured and stored such that any correction required may be implemented. In some embodiments, a calibration routine is performed on the fabricated DAC prior to use. A calibration routine may measure the resistance of some or all of the resistor legs in the DAC in order to detect resistor mismatch. For example, the calibration routine may compare some or all of the resistors in the DAC with a reference resistance of a known value. An alternative calibration routine may step through the input DAC code and measure the step size errors (DNL) of each transition or measure the output voltage at selected input codes. An algorithm may then calculate the relative contribution of each bit depending on the measured step size errors or output values. The error in resistance value, which may be a function of the difference between the measured resistance and the resistance of a reference, may be stored in memory for future use (e.g. operation of the DAC). Any suitable method may be used to store error value(s) which are preferably linked in some manner to the resistor to which they relate. Accordingly, error information relating to a particular resistor or leg of the DAC may be returned from memory when required. In some embodiments, resistor error information is stored in a look up table.

Figure 12:
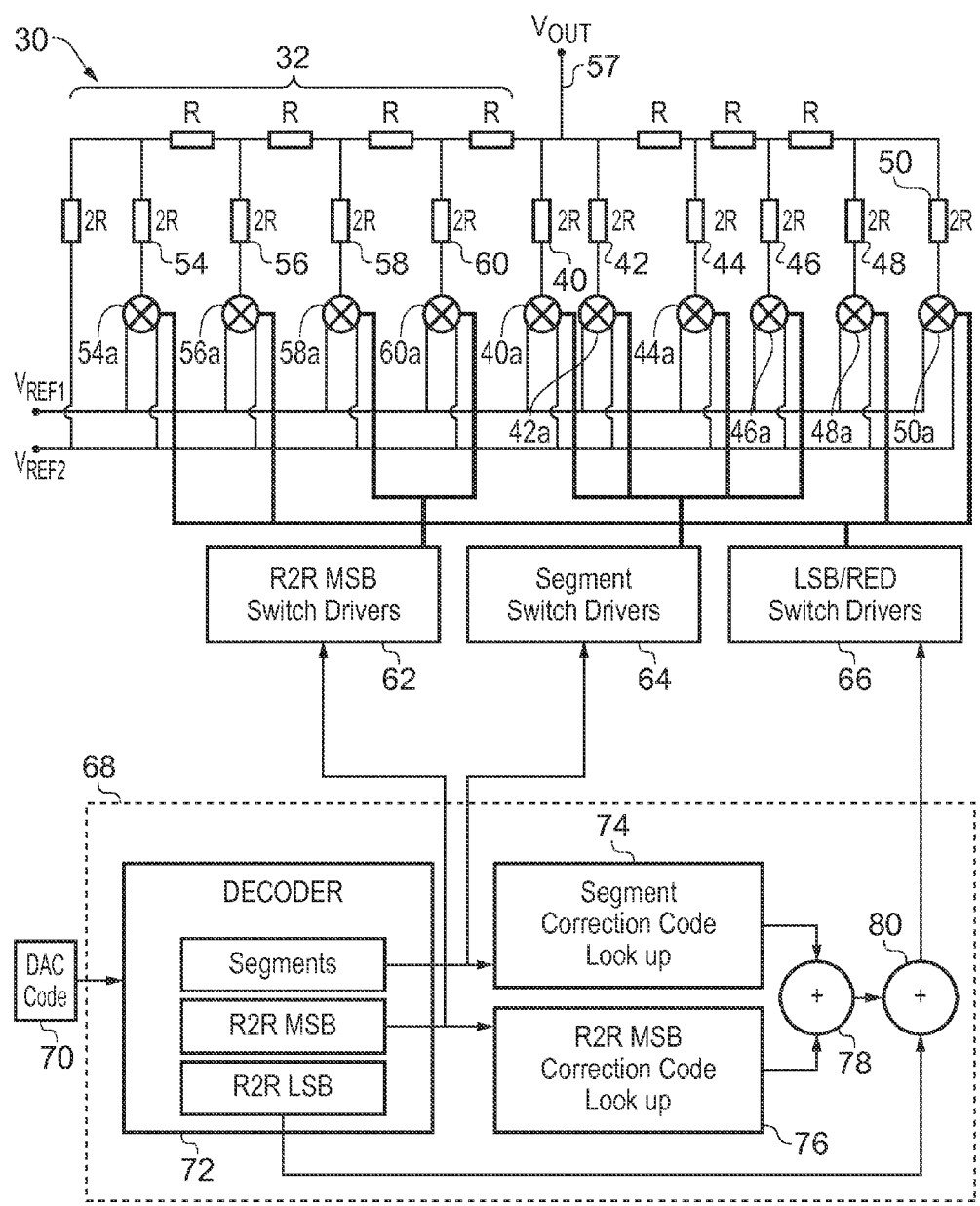
FIG. 12 is a schematic diagram of a segmented R2R DAC including a DAC control module.

Referring now to FIG. 12, a system is illustrated for driving the DAC 30 formed in accordance with some embodiments of this disclosure. Switch driver circuits 62, 64, 66 may be coupled to the switches of the DAC 30. The switch driver circuits 62, 64, 66 may be provided as separate elements from each other on a die or as a single circuit operable to drive switches in accordance with a desired switching regime. Equally, switch driver circuits 62, 64, 66 may be integral to the DAC or provided separately. In the embodiment shown, an R2R MSB switch driver 62 provides control to the switches 58a, 60a of the MSB legs 58, 60 of the R2R network of the first section 32, a segment switch driver 64 provides control to the switches 40a, 42a, 44a, 46a of the more significant current flow paths in the second section 34, such as the thermometer encoded legs 40 and 42, and the more significant current flow paths of the second R2R DAC 36. An LSB/redundancy switch driver 66 provides control to the switches 54a, 56a, 48a, 50a of the correction bits (LSB legs 54, 56 of the R2R network of the first section 32 and the two redundancy legs 48, 50). The switch drivers 62, 64, 66 are coupled to a DAC controller 68. The DAC controller 68 may receive a conventional DAC code and perform one or more of (a) adjusting the code for the redundancy switching regime, (b) adding correction based on calibration data stored in volatile or non-volatile memory, and (c) providing an adjusted redundancy DAC code to the switch drivers 62, 64, 66 to implement the received DAC code.

The DAC controller 68 may comprise a decoder 72 operable to convert a conventional DAC code 70 into a redundancy DAC code as described above, together with segment and R2R MSB correction code look up modules 74, 76 and first and second summers 78, 80. Outputs of the decoder 72 relating to control of the R2R MSB switches 58a, 60a and the switches 40a, 42a of the segments are connected both to the R2R MSB and segment switch driver circuits 62, 64 and the segment and R2R MSB correction code look up modules 74, 76. Outputs of the segment correction code look up module 74 and the R2R MSB correction code look up module 76 are combined at the first summer 78, the output of which is combined at the second summer 80 with the portion of the redundancy DAC code relating to the R2R LSB switches 54a,

56a, received from the decoder 72. The output of the second summer is then provided to the LSB and redundancy switch driver circuit 66.

Figure 13:
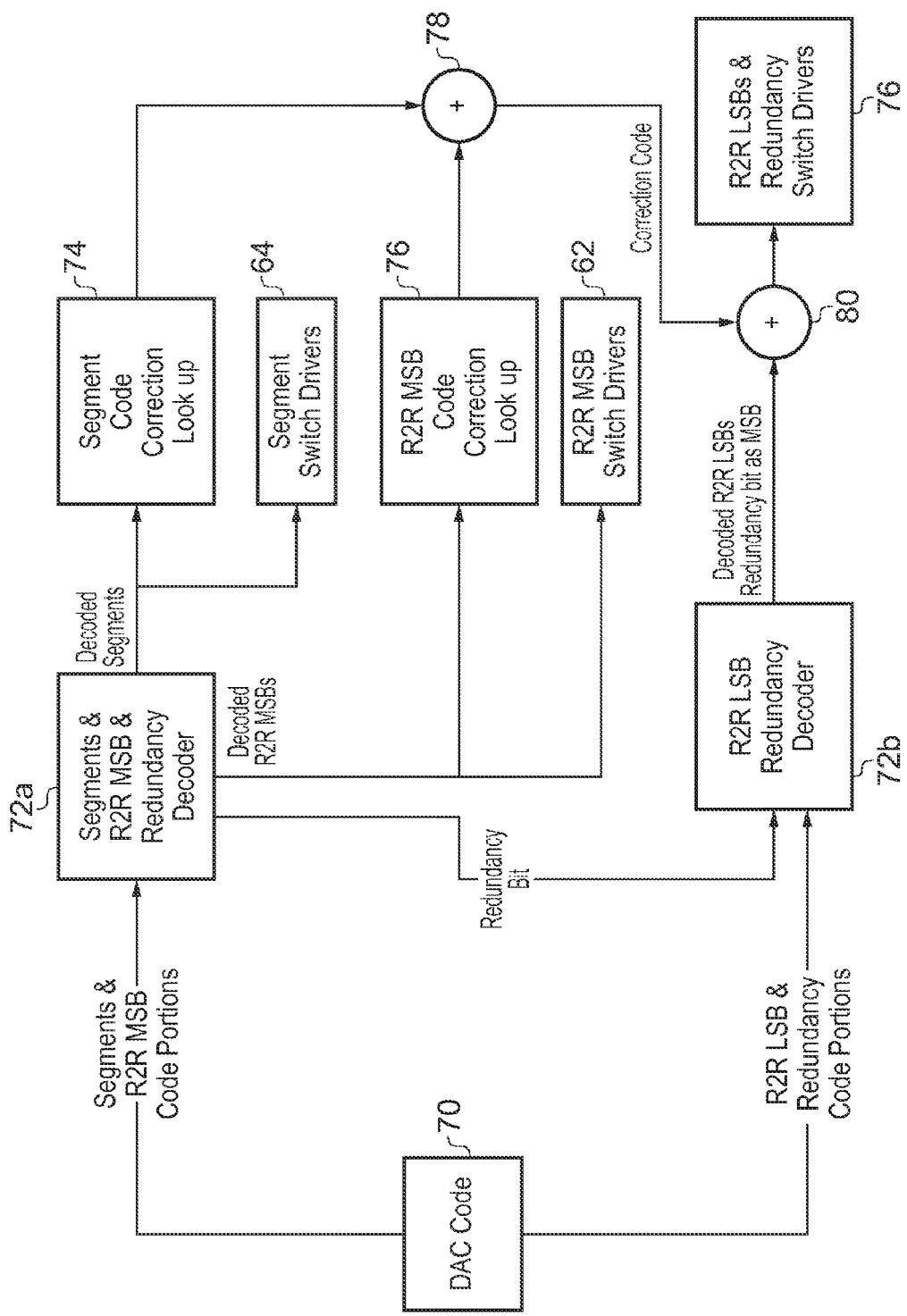
FIG. 13 is a flow diagram of the operation of the segmented R2R DAC shown in FIG. 12.

FIG. 13 shows a more detailed view of the DAC controller 68 together with the switch drivers 62, 64, 66. In particular, the decoder 72 is shown comprising a segment and R2R MSB decoder 72a and an R2R LSB and redundancy decoder 72b. For simplicity, the DAC 30 and connections between the switch drivers 62, 64, 66 and switches 44a to 60a of the DAC 30 are not shown.

During operation, a DAC code 70 is received and split into code portions corresponding, on the one hand, to the segment and R2R MSB switches 40a, 42a, 58a, 90a—provided to the segment and R2R MSB decoder 72a—and on the other hand to the R2R LSB and redundancy switches 48a, 50a, 54a, 56a—provided to the R2R LSB redundancy decoder 72b. The received DAC code may have already been converted into a format switchable for driving a DAC having a thermometer encoded most significant bit section.

Based on the redundancy algorithm adopted, the segment and R2R MSB decoder 72a may convert the received code portions to reflect the chosen algorithm. In one embodiment, this may involve subtracting a value, which may be the value of the redundancy bit (or the largest redundancy bit), from portions of the code corresponding to the segments and the R2R MSBs. The adjusted redundancy DAC code is then output from the decoder 72a directly to the R2R MSB and segment switch drivers 62, 64 since the values of the segment and R2R MSB switches 40, 42, 44, 46, 58, 60 does not change in response to a bit error correction algorithm. In addition, however, in order to determine the correction code for the redundancy and R2R LSB switches 48a, 50a, 54a, 56a, the output redundancy DAC code is also output to a segment code correction look up module 74 and an R2R MSB code correction look up module 76, the function of which will be described below.

The R2R LSB and redundancy decoder 72b may receive a conventional DAC code portion corresponding to the R2R LSB and redundancy switches 48a, 50a, 54a, 56a and generate a redundancy DAC code based on a chosen redundancy scheme. As described above, the value of the redundancy bit may be adjusted high or low depending on the values of the segments and the MSBs of the R2R ladder of the first section 32. For example, the redundancy bit may be driven high when the input DAC code is $2^x$ and subsequently switched every $2^{x-1}$ DAC code increments. Accordingly, a redundancy bit signal from the segment and R2R MSB decoder 72a is provided to the R2R LSB redundancy decoder 72b configured to signal the R2R LSB and redundancy decoder 72b to set or unset the redundancy bit in the redundancy DAC code. The code portion of the DAC code relating to the R2R LSBs is not modified by the R2R LSB and redundancy decoder 72b and so remains unchanged.

As mentioned above, the output redundancy DAC code from the segment and R2R MSB decoder is also output to a segment code correction look up module 74 and an R2R MSB code correction look up module 76. At the segment code correction look up module 74, the received code portion is compared with a corresponding entry in a look up table to check whether correction is required to account for errors in components of the resistors 40, 42 which in this example are part of a thermometer encoded section of the DAC. If correction is required, a correction code is sent to the summer 78. Similarly, at the R2R MSB code correction look up module 76, the received code portion is compared with a corresponding entry in a look up table to check whether correction is required to account for errors in components of the R2R MSB resistors 58, 60. If correction is required, a correction code is sent to the summer 78 where it is combined with the correction code received from the segment code correction look up module 74.

An output of the first summer 78 is then provided to the second summer 80 where it is combined with the output from the R2R and redundancy decoder 72b to correct for component mismatch in the R2R MSB resistors 58, 60 and segment resistors 40, 42. The output of the further summer 80 is then provided to the LSB/redundancy switch driver 66 which adjusts the state of switches 54, 56, 48, 50 in accordance with the redundancy DAC code and the calculated correction code.

Redundancy DAC embodiments described so far have provided a correction resolution of 1 LSB. In other words, with reference to FIG. 9 as an example, a redundancy DAC 30 is provided with 2 LSB legs 54, 56 and a redundancy bit 48, 50 which can be switched to adjust the output voltage $V_{out}$ at node 57 by increments equal to value of the least significant bit 54. In other embodiments, however, it may be desirable to increase the resolution of the correction such that finer adjustments can be made to the output voltage so as to achieve the best possible analog representation of an input DAC code. An example architecture for doing so is shown in FIG. 14 in which a redundancy DAC 100 is provided having an architecture similar to that shown previously. However, the DAC 100 has been modified with the addition of two extra fine trim legs 102, 104 to the main R2R ladder network of the first section. The fine trim legs 102, 104, provide a weighting to the output node 57 of one quarter and one half, respectively, of that of the least significant bit 54. Accordingly, the four least significant legs 102, 104, 54, 56 of the main R2R network (collectively indicated as 112) together with the two redundancy legs 48, 50 provide an adjustment resolution of 0.25 times the weight of 1 LSB, i.e. 0.25 LSBs. It will be appreciated that whilst FIG. 14 shows the additional legs being provided in the main R2R network, fine trim legs could equally be provided in the second DAC 36 in a similar manner.

To assist the explanation of the effect of increased adjustment resolution, the redundancy DAC 100 shown in FIG. 14 has been provided with a 10% resistance error in one of its more significant legs 40. Accordingly, the leg 40 provides a weight of 17.6 LSBs to the output node 57 when coupled to $V_{ref1}$ as shown. However, due to the presence of the fine trim legs 102, 104 the output voltage can be corrected to within 0.25 LSBs of the required output voltage $V_{out}$. For example, as shown in FIGS. 14 and 15 for a DAC code of 18, in order to correct for the resistance mismatch of the non-ideal segment resistor 40, the 2 LSB weighted leg 56 is unset (switched from $V_{ref1}$ to $V_{ref2}$) and the 0.5 LSB leg 104 is set to provide an output voltage $V_{out}$ to the output node 57 of 18.1 LSBs. It will be appreciated that depending on the accuracy required at the output node 57, additional lower weighted resistors can continue to be added at the least significant end of the main R2R ladder network of the first section or the second R2R network 36 of the second section to increase the resolution of the correction bits.

Whilst the DACs described above have all included 2 bits of redundancy (carrying a weight of 4 LSBs split into two 2 LSB legs), in other embodiments any number and/or weight of redundancy legs may be provided. There are multiple arrangements of the redundancy DAC which provide an effective redundancy scheme. These may include one or more of (a) toggling the redundancy legs of the DAC together or separately, (b) changing the weight of the redundancy legs as a whole or relative to one another or (c) generally increasing the amount of redundancy in the DAC.

FIG. 16 provides an example DAC in which the distribution of redundancy has been varied. A DAC 120 is provided with a first section 122 comprising a main R2R resistor ladder network and with a second section 123 comprising two parallel 2R resistors 128 and a second R2R resistor ladder network 130. However, in contrast to the second R2R ladder networks described previously, the R2R ladder network 130 comprises two R-2R portions 131, 132 and a non terminated 2R leg 134, the final R-2R portion 132 and the final 2R leg 134 each having a weight of 4 LSBs to provide 8 LSBs of redundancy to the DAC 120.

The redundancy legs 132, 134 can be toggled either simultaneously or independently, and can provide a correction trim of up to ±7 LSBs. In either case, a different switching regime is preferably adopted. Where the redundancy legs 132, 134 are toggled simultaneously, the first three R2R legs 138, 140, 142 of the first section 122 may be used to trim the DAC and are operable to provide correction trim to a weight of ±7 LSBs in addition to the redundancy bits 132, 134 which when toggled together provide the a correction trim of ±8 LSBs. A table illustrating the code sequence for conventional input DAC codes is shown in FIG. 17.

In the second regime in which the redundancy legs 132, 134 of the DAC 120 are toggled separately, only the two least significant R2R legs 138, 140 of the first section 122 are used to trim the DAC, the two redundancy legs 132, 134 providing further correction each of up to ±4 LSBs, depending on their state at a particular transition. FIG. 18 shows an example switching regime for the DAC 120 when the redundancy legs 132, 134 are toggled independently.

In both cases, the increased weight of the redundancy bits means that the trim range provided by the correction bits of the DAC is increased.

In yet a further variation, shown in FIG. 19, a DAC 150 is provided having a first section 152 comprising a main R2R resistor ladder network and a second section 153 comprising two parallel 2R legs and a second R2R network 156. However, in contrast to the DAC 120 of FIG. 16, the second R2R network 156 comprises four R2R legs 156.1-156.4 together with the single non-terminating 2R resistor leg 157. This configuration provides increased resolution to the redundancy bits 158.

Figure 20:
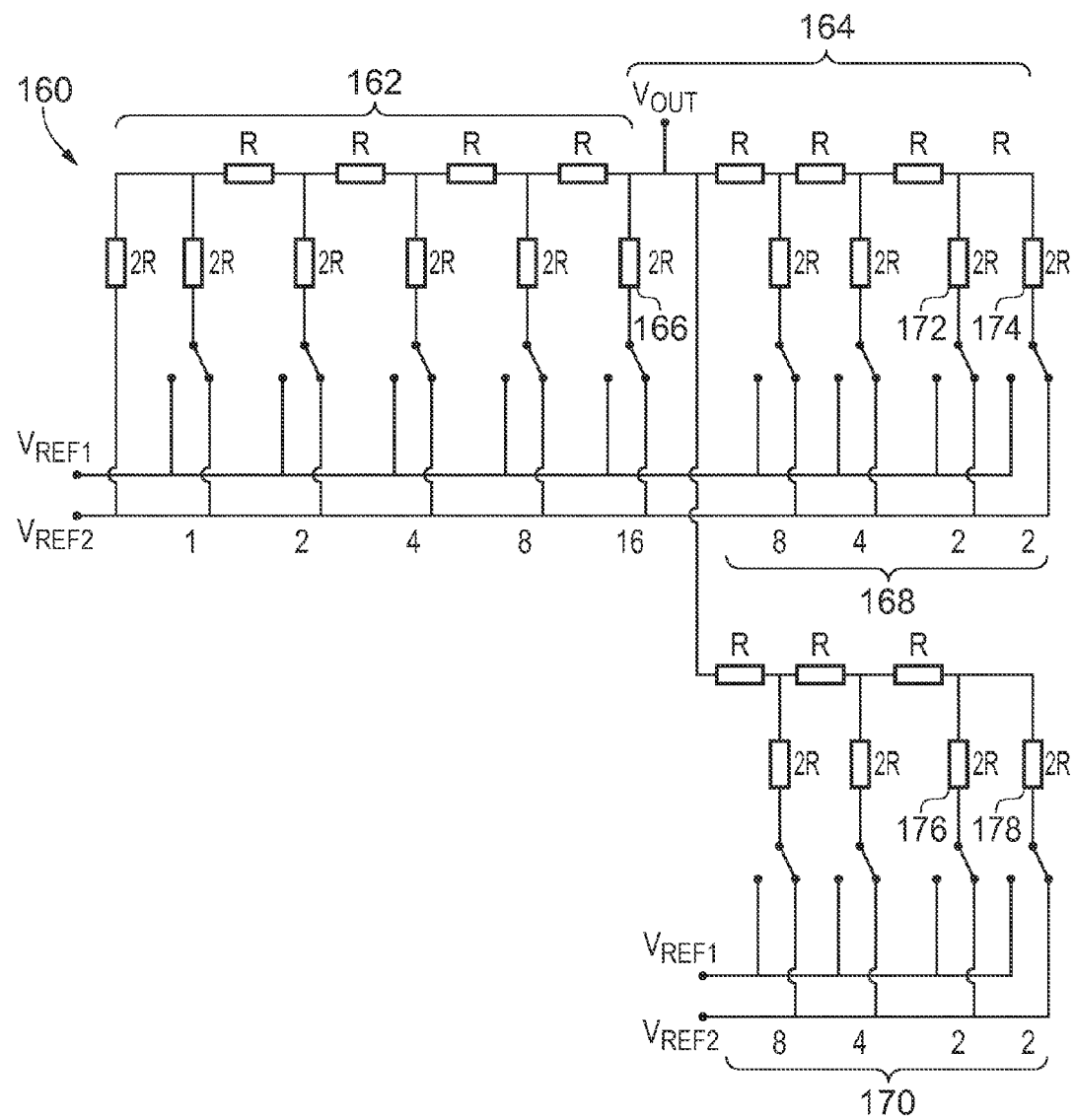
FIG. 20 is a schematic diagram of a further variation of the segmented R2R DAC shown in FIG. 5.

In yet a further variation, FIG. 20 shows an embodiment in which a DAC 160 is provided having a first section 162 comprising a main R2R ladder network and a second section 164. The second section 164 comprises an optional thermometer encoded section represented for diagrammatic simplicity as a single parallel 2R resistor 166. The second section further comprises second and third R2R ladder networks 168, 170. Hence, in contrast to the DAC 30 shown in FIG. 9, one of the parallel 2R resistors of the second section 164 has been replaced with an R2R ladder network 170. The resultant architecture provides for further redundancy and resolution in the redundancy bits. For example, the least significant legs 172, 174 of the second R2R network 168 and/or the least significant legs 176, 178 of the third R2R network 170 can be used as redundancy bits for the DAC 160. It will be appreciated that the effective impedance of the third R2R network 170 is equivalent to that of the replaced single 2R parallel resistor.

Figure 21:
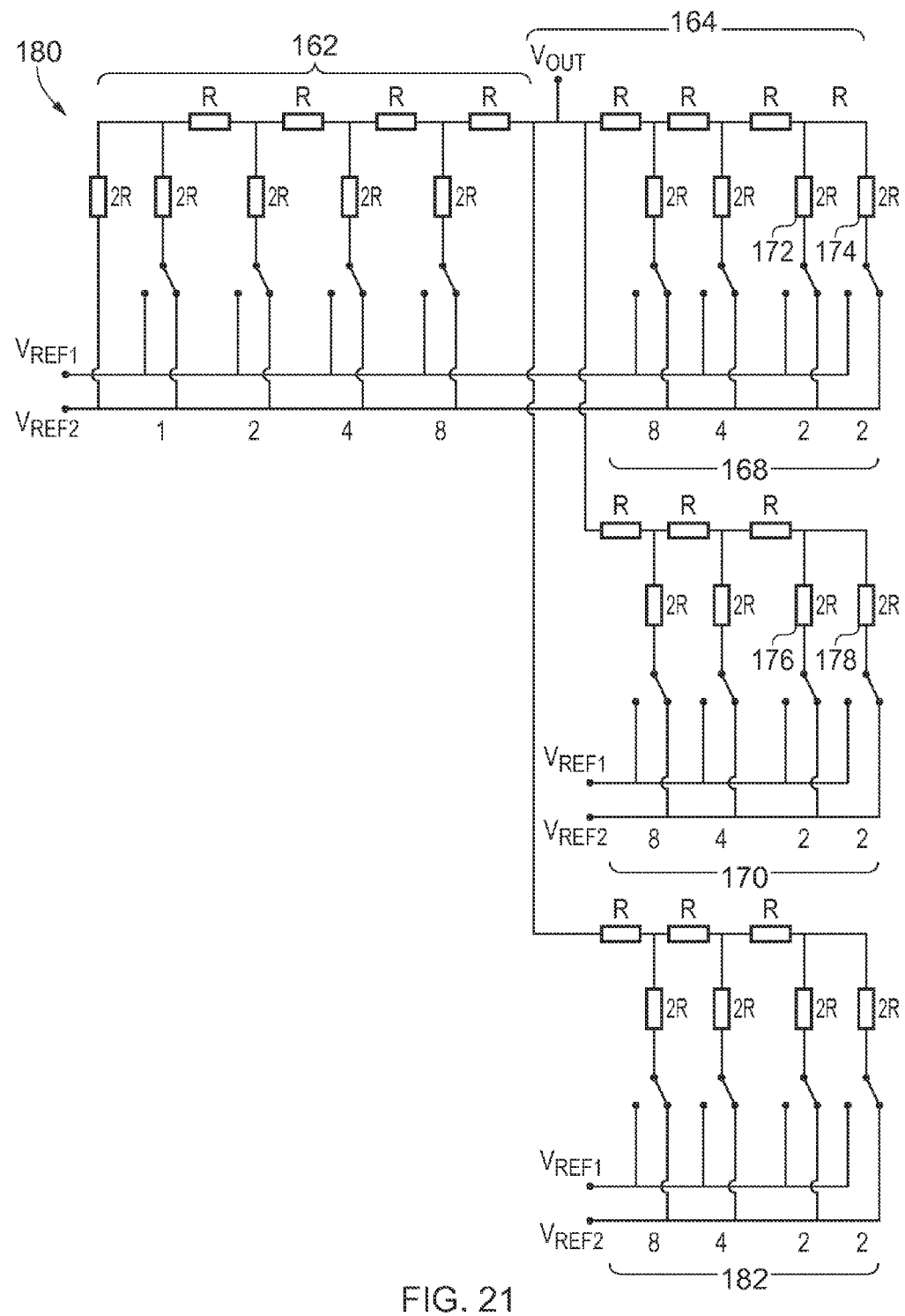
FIG. 21 is a schematic diagram of a further variation of the segmented R2R DAC shown in FIG. 5.

Moving yet further from the DAC 160 shown in FIG. 20, FIG. 21 shows a DAC 180 which has been modified from the DAC 160 in FIG. 16 by the replacement of a further thermometer leg with a fourth R2R ladder network 182, providing yet further possibilities for redundancy configurations.

Figure 22:
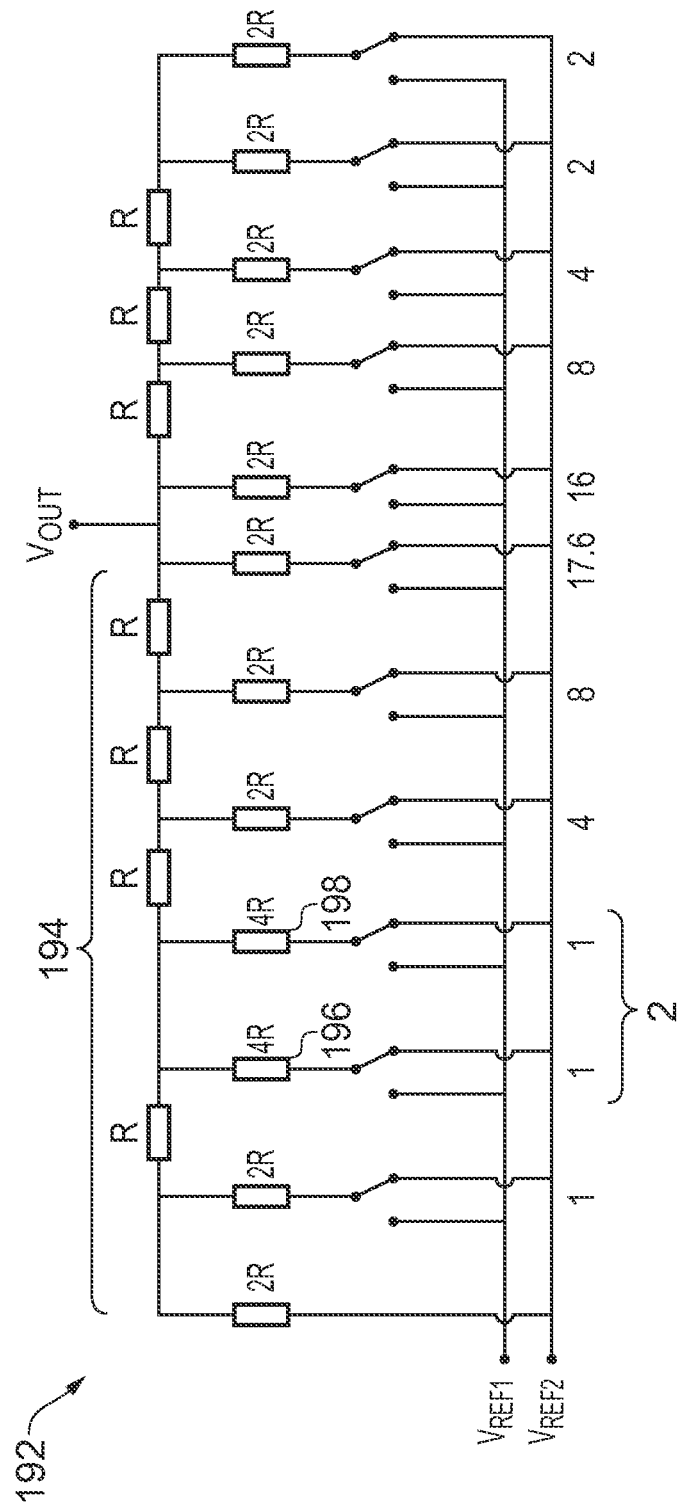
FIG. 22 is a schematic diagram of a further variation of the segmented R2R DAC shown in FIG. 5.

In a further variation, instead of or in addition to the provision of fine trim legs as described with reference to FIG. 14, additional legs may be provided to the main and second R2R DACs as shown in FIG. 22 in order to increase the possible switching configurations available relative to a conventional DAC of equivalent size. FIG. 22 shows a DAC 192 equivalent to the DAC 30 of FIG. 5, apart from that the 2 LSB weighted leg of the R2R ladder network 32 of DAC 30 is replaced with two parallel 1 LSB weighted legs 196, 198 each having a resistance value of 4R. Legs 196, 198 may be switched as a pair or separately. Appropriate switching of the legs of the DAC 192 may provide sufficient trimming to take into account of any mismatch in contribution of the more significant bits. It will be appreciated that any of the 2R legs of the R2R ladder network 194 could be replaced by a plurality of parallel legs having a combined equivalent weighting to that of the replaced 2R leg.

It will be also appreciated that the embodiment described with reference to FIG. 22 may be combined with other embodiments described above in any suitable manner in order to accommodate for component mismatch. For example, in some embodiments, redundancy may be provided in both the main R2R DAC and subsequent R2R DACs.

In the above embodiments we have focused on increasing redundancy in DACs in order to reduce the instances in which a target voltage cannot be reached due to component mismatch within a device. However, the inventors have also realized that correction bits in embodiments described above may also be used to reduce output glitches associated with switching transitions in DACs. As is known in the art, glitch may be described as an unwanted voltage disturbance, overshoot or undershoot during a code transition. Such voltage variations may contribute to device non-linearity, particularly under AC conditions. There are two main reasons for glitch. The first is due to the timing discrepancies in switching of multiple resistor legs. The second is the time variation in signal propagation from individual legs to the output. This is caused by an RC delay due to the resistance of the resistors and the intrinsic capacitance of the resistors and the substrate/metal of each leg. The impact of these delays increases both when larger weighted legs of a DAC are switched and also when an increased number of legs of the DAC are switched simultaneously. To a lesser degree, such delays also increase the further apart two simultaneously switched legs are from one another. In a conventional prior art R2R DACs, the largest glitch is found at mid code since this is the point at which all resistor legs switch at the same time.

Previous attempts to reduce glitch have included using fully segmented DACs, as exemplified by a fully thermometer encoded DAC. In such configurations, because only one leg changes between consecutive codes, glitch is minimized. However, fully segmented DACs take up an enormous amount of space on chip relative to their R2R counterparts.

Embodiments of the segmented R2R with inbuilt redundancy as described above may provide a compromise between reduced glitch and reduced device area. Using the redundancy structure shown in, for example, FIG. 12 the number of resistor legs changing polarity at any given time can be reduced. This may be achieved by using the redundant bits to provide alternative switching configurations to reach a given output voltage. In order to minimize glitch, the aim is to provide, for any one transition:

(a) as few legs switching at a time as possible,
(b) legs which are switching to be as close together as possible, and
(c) legs which are switching to be as close as possible to the output node of the DAC in question or, alternatively, legs which are switching to have an equal impedance relative to the output node as that of an equally weighted counterpart in a separate R2R network also switching in a similar manner.

Operation of a glitch reduction switching scheme according to some embodiments will now be described with reference to FIGS. 23, 24, 25 and 26.

Figure 23:
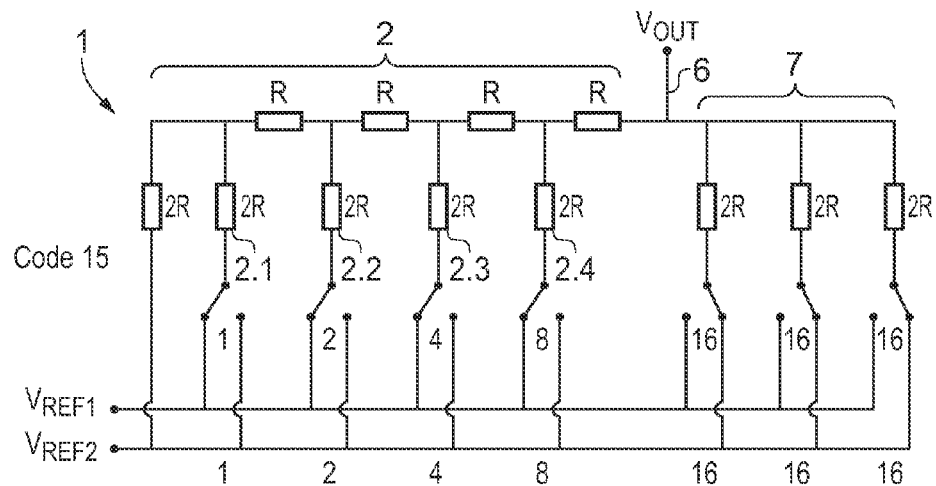
FIGS. 23 and 24 are schematic diagrams of the segmented R2R DAC of FIG. 1 transitioning from input DAC code 15 to input DAC code 16.
Figure 24:
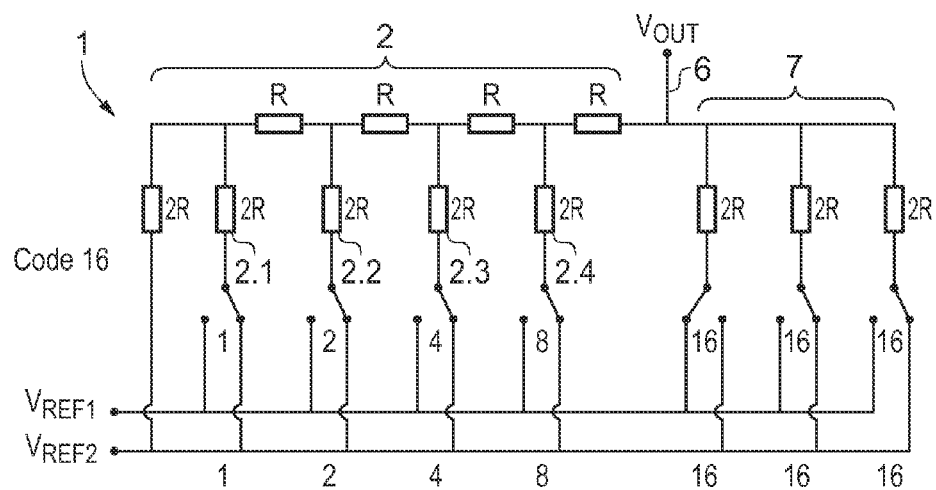

FIGS. 23 and 24 show DAC 1 of FIG. 1 transitioning between DAC code 15 and code 16. During this transition all of the legs 2.1 to 2.4 of the R2R resistor network of the first section 2 transition from $V_{ref1}$ to $V_{ref2}$ (unset) at the same time as one of the significant bits of the second section 7 transitions from $V_{ref2}$ to $V_{ref1}$. Accordingly, this transition causes a significant glitch on the output voltage due to the effects described above.

Referring now to FIGS. 25 and 26, the DAC 30 shown in FIG. 5 is illustrated, this time transitioning from code 20 in FIG. 25 to code 21 in FIG. 26. At code 20, shown in FIG. 5, legs 54, 56, 40, 42, 48 and 50 are unset (switched to $V_{ref2}$), whilst legs 58, 60, 44, and 46 are set (switched to $V_{ref1}$). During the transition from code 20 to 21, a segment 42 of relatively large weight and thus contribution to the output voltage (parallel 2R resistor 40) is switched from $V_{ref2}$ to $V_{ref1}$. To minimize the glitch associated with this transition, two lower weighted legs (in this example leg 60 and leg 44 each having a weight of 8 LSBs, i.e. half that of leg 40) are switched from $V_{ref1}$ to $V_{ref2}$ thus reducing their contribution to $V_{out}$ by an amount equal to that of the segmented leg 40. Accordingly, the glitch associated with the transition of the leg 40 having a weight of 16 LSBs is cancelled by the transition of the two half-weighted legs 60, 44. In addition because the equally weighted legs 60, 44 have a substantially equal impedance relative to the output node 57, any glitch introduced by the transition of one is cancelled by the other.

It will be appreciated that, at the same time as the above transitions, so that the output voltage at the output node 57 reflects the increasing code from 20 to 21, the least significant leg 54 is transitioned from $V_{ref2}$ to $V_{ref1}$. However due to the comparable insignificance of the weight of this leg 54, any glitch introduced by this transition is insignificant in comparison to the glitch which would otherwise have been associated with the high weighted leg 40 transitioning from $V_{ref2}$ to $V_{ref1}$ using a conventional switching scheme.

Figures 27, 28:
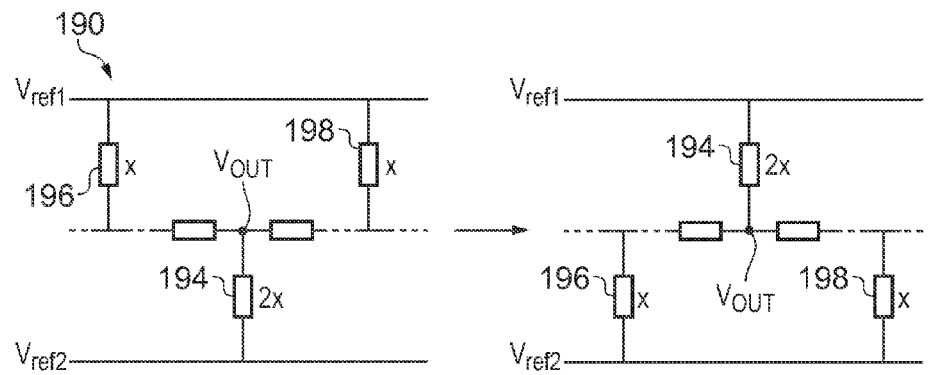
FIG. 27 is a schematic diagram of a generic segmented R2R DAC transitioning in accordance with a glitch reduction switching scheme.
FIG. 28 is a table showing switch states during transitions of the segmented R2R DAC of FIGS. 25 and 26 using a glitch reduction switching scheme.

The method of reducing glitch during the transition of highly weighted legs of the redundancy DAC can be described with reference to FIG. 27 which shows a simplified version of the redundancy DAC in accordance with some embodiments of this disclosure. In FIG. 27, switches of the resistor legs are not shown. Instead, the resistors legs of the DAC are shown fixed either to a $V_{ref1}$ or $V_{ref2}$. It will be appreciated that the switches are present but not shown and in each case each resistor leg is switchable between $V_{ref1}$ and $V_{ref2}$. The DAC 190 may comprise a main R2R resistor ladder network in a first section, a second section which may include multiple parallel current flow legs and a second R2R ladder having inherent redundancy (all not shown). During the transition of the most significant bit 194 from $V_{ref1}$ to $V_{ref2}$ two legs 196, 198 preferably positioned either side of the output node $V_{out}$ and each having a weight equal to half the weight of the most significant leg 194, are simultaneously switched from $V_{ref1}$ to $V_{ref2}$. Accordingly, the delay associated with the switching transition of the leg 196 of the main R2R DAC substantially cancels the delay associated with switching of the leg 198 in the second R2R DAC due to their positioning and respective impedances relative to the output node $V_{out}$.

It will be appreciated that in a preferred embodiment this transition coincides with a transition of the least significant bit from $V_{ref2}$ to $V_{ref1}$ so that the output voltage increases with the increment in input DAC code. This is shown more clearly in FIG. 28 which lists the switch status for each of the legs of the DAC shown in FIG. 16 being switched in accordance with a glitch reduction scheme. Referring first to the transition from DAC code 10 to code 11, a leg having a weight of 8 LSBs is switched from logic 0 to logic 1 and simultaneously two legs having a weight of 4 LSBs are switched from logic 1 to logic 0 and the least significant bit is transitioned from logic 0 to logic 1. Similarly, in the transition from DAC code 20 to 21, the leg weighted at 16 LSBs (a segmented portion) is transitioned from logic 0 to logic 1 and simultaneously to the two legs weighted at 8 LSBs transitioned from logic 1 to logic 0. Again, this transition coincides with a transition of the least significant bit from logic 0 to logic 1.

It will be appreciated that the glitch reduction switch pattern decreases the trim correction range at the same time as reducing glitch within the DAC. Accordingly, in some situations a compromise may be made between the glitch reduction switching regime, in which glitch is minimized, and a redundancy regime in which the range of the correction available to the output voltage is maximized.

Whilst embodiments have been described with reference to voltage-mode DACs, it will be appreciated that current-mode equivalents may be similarly implemented. It will also be appreciated that methods described above for reducing glitch may be relevant to current-mode devices which have larger switching glitch than voltage-mode devices since their switches connect directly to the output line(s).

It will also be appreciated that DACs described above may be implemented using discrete components or implemented on one or more integrated circuits. In order to increase linearity, resistor legs of DACs implemented in ICs are preferably deposited in the same fabrication step.

It is thus possible to provide an improved DAC.

The claims presented herewith are drafted in single dependency format suitable for use at the US patent office. However it is to be understood that any claim may depend on any preceding claim of the same type unless that is clearly not technically feasible.

The invention claimed is:

1. A digital-to-analog converter (DAC) comprising:
a first section including a converter network of a first type having a first plurality of current flow paths forming binary weighted values in the DAC; and
a second section including a second converter network of the first type, connected to the first section, and having a second plurality of current flow paths;
wherein the first and second sections are joined together by a shared connection to an output node of the DAC,
wherein each of the first and second plurality of current flow paths are switchable between first and second nodes, and
wherein weights of one or more of the second plurality of current flow paths are substantially equal to weights of one or more of the first plurality of current flow paths to provide redundancy in the DAC.

2. A DAC as claimed in claim 1, wherein the first type is a R-2R ladder network.

3. A DAC as claimed in claim 1, wherein the second plurality of current flow paths form binary weighted values in the DAC.

4. A DAC as claimed in claim 3, wherein the second section further comprises a fourth plurality of current flow paths forming binary weighted values in the DAC.

5. A DAC as claimed in claim 1, wherein the first node is connected to a first reference voltage and the second node is connected to a second reference voltage.

6. A DAC as claimed in claim 1, wherein the second section further comprises a third plurality of current flow paths forming equally weighted values in the DAC.

7. A DAC as claimed in claim 6, further comprising a controller operable to drive switches for controlling each of the current flow paths of the DAC so as to delay the transition of one or more of the third plurality of current flow paths until one or more lower weighted current flow paths of the first section are switched into connection with the first node.

8. A DAC as claimed in claim 7, wherein the controller drives at least some of the switches of the DAC in response to an error value resulting at least partially from errors in values of components in the DAC, or due to changes in the values that occur in use.

9. A DAC as claimed in claim 8, wherein the error value results from errors in values of components of the DAC having a significant contribution to the output voltage of the DAC.

10. A DAC as claimed in claim 7, further comprising memory for storing one or more of the component values or error values of components in the DAC.

11. A DAC as claimed in claim 7, wherein a first current flow path of the first plurality of current flow paths and a second current flow path of the second plurality of current flow paths have a combined output voltage contribution of N volts, and wherein the controller is operable to drive the switches of the DAC such that transition of the first and second current flow paths from the first reference voltage to the second reference voltage coincides with a transition of a third current flow path of the DAC having an output voltage contribution of N volts from the second reference voltage to the first reference voltage.

12. A method of driving a digital-to-analog converter (DAC) comprising:
receiving an input DAC code;
deriving an output DAC code which differs from the input code;
driving selective switches of a first section including a converter network of a first type having a first plurality of current flow paths forming binary weighted values in the DAC based on the output DAC code; and
driving selective switches a second section connected to the first section and including a second converter network of the first type having a second plurality of current flow paths based on the output DAC code,
wherein weights of one or more of the second plurality of current flow paths are substantially equal to weights of one or more of the first plurality of current flow paths to provide redundancy in the DAC.

13. A method as claimed in claim 12, wherein the output DAC code is derived such that transition of a weighted current flow path having a first weight only takes place when one or more weighted current flow paths of the first binary weighted section and having weights less than the first weight are switched into connection with the second node.

14. A method as claimed in claim 13, wherein the value of error results from errors in values of current flow paths of the DAC having a contribution above a first threshold to the output voltage of the DAC.

15. A method as claimed in claim 12, wherein the step of deriving the output DAC code comprises:
calculating an error value based on one or more errors in values of components in the DAC; and
adjusting the output DAC code based at least partially on the calculated error value.

16. A method as claimed in claim 12, wherein the output DAC code is derived such that a first current flow path of the first plurality of current flow paths and a second current flow path of the second plurality of current flow paths having a combined output voltage contribution of N volts are switched from the first node to the second node at the same time as a third current flow path of the DAC having an output voltage contribution of N volts is switched from the second node to the first node.

17. An integrated circuit, comprising:
a digital-to-analog converter (DAC) comprising:
a first section including a converter network of a first type having a first plurality of current flow paths forming binary weighted values in the DAC; and
a second section connected to the first section and including a second converter network of the first type having a second plurality of current flow paths;
wherein the first and second sections are joined together by a shared connection to an output node of the DAC,
wherein each of the first and second plurality of current flow paths are switchable between first and second nodes, and
wherein weights of one or more of the second plurality of current flow paths are substantially equal to weights of one or more of the first plurality of current flow paths to provide redundancy in the DAC.

18. The integrated circuit of claim 17, wherein the first type is a R-2R ladder network.

19. A digital-to-analog converter (DAC) comprising:
a first section including a converter network of a first type having a first plurality of current flow paths forming binary weighted values in the DAC; and
a second section including a second converter network of the first type, connected to the first section at an output node of the DAC, the second section having a second plurality of current flow paths forming binary weighted values in the DAC and a third plurality of current flow paths forming substantially equally weighted values in the DAC,
wherein each of the first and second plurality of current flow paths are switchable between first and second nodes, and
wherein weights of one or more of the second plurality of current flow paths are substantially equal to weights of one or more of the first plurality of current flow paths so as to provide redundancy in the first section.

20. The DAC of claim 19, wherein the first type is a R-2R ladder network.

* * * * *